United States Patent
Langer et al.

(10) Patent No.: US 9,973,370 B1
(45) Date of Patent: May 15, 2018

(54) MEMORY PREDISTORTION IN BANDWIDTH LIMITED ENVELOPE TRACKING

(71) Applicant: Intel IP Corporation, Santa Clara, CA (US)

(72) Inventors: Andreas Langer, Lohhof (DE); Christoph Hepp, Neubiberg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days. days.

(21) Appl. No.: 15/614,817

(22) Filed: Jun. 6, 2017

(51) Int. Cl.
*H04L 27/36* (2006.01)
*H04W 52/52* (2009.01)

(52) U.S. Cl.
CPC ........... *H04L 27/368* (2013.01); *H04W 52/52* (2013.01)

(58) Field of Classification Search
CPC ............................ H04L 27/368; H04W 52/52
See application file for complete search history.

(56) References Cited

U.S. PATENT DOCUMENTS

| | | | | |
|---|---|---|---|---|
| 8,909,175 B1* | 12/2014 | McCallister | .......... | H04L 27/368 330/127 |
| 9,118,277 B2* | 8/2015 | Balteanu | ............... | H03F 1/0227 |
| 2010/0295613 A1* | 11/2010 | Asbeck | ................ | H03F 1/0216 330/149 |
| 2016/0126901 A1* | 5/2016 | Knopik | ................ | H03F 1/0266 330/296 |

* cited by examiner

*Primary Examiner* — Vineeta Panwalkar
(74) *Attorney, Agent, or Firm* — Schwegman Lundberg & Woessner, P.A.

(57) ABSTRACT

An apparatus compensates nonlinearities in envelope tracking (ET) used in a mobile device by limiting a bandwidth of an envelope signal representing an envelope of an input baseband signal to be less than a bandwidth of tracker circuitry, generating a scaled replica of an output signal of the tracker circuitry based on the bandwidth-limited envelope signal, and generating a model distortion signal based on the scaled replica and the input baseband signal, where the model distortion signal emulates ET linearity degradation. The apparatus is further configured to generate an output baseband signal based on the scaled replica, the model distortion signal, and the input baseband signal, where the output baseband signal is pre-distorted relative to the input baseband signal according to the scaled replica, the model distortion signal, and the input baseband signal to compensate for degradations in transmit signal quality due to ET nonlinearities.

29 Claims, 11 Drawing Sheets

MEMORY PREDISTORTION IN BANDWIDTH LIMITED ENVELOPE TRACKING

BACKGROUND

Envelope tracking direct current-direct current (DC-DC) converters or envelope tracking modulators perform envelope tracking of signals to be transmitted, e.g., a baseband signal or a radio frequency (RF) signal input to power amplifier (PA) circuitry, and provide a variable power supply voltage to the PA circuitry according to the tracked envelope in order to increase PA efficiency and optimize PA power consumption, e.g., reduce the PA current draw. Envelope tracking facilitates continuously adjusting the PA power supply voltage to operate the PA circuitry at or close to peak efficiency for the given instantaneous output power requirements.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
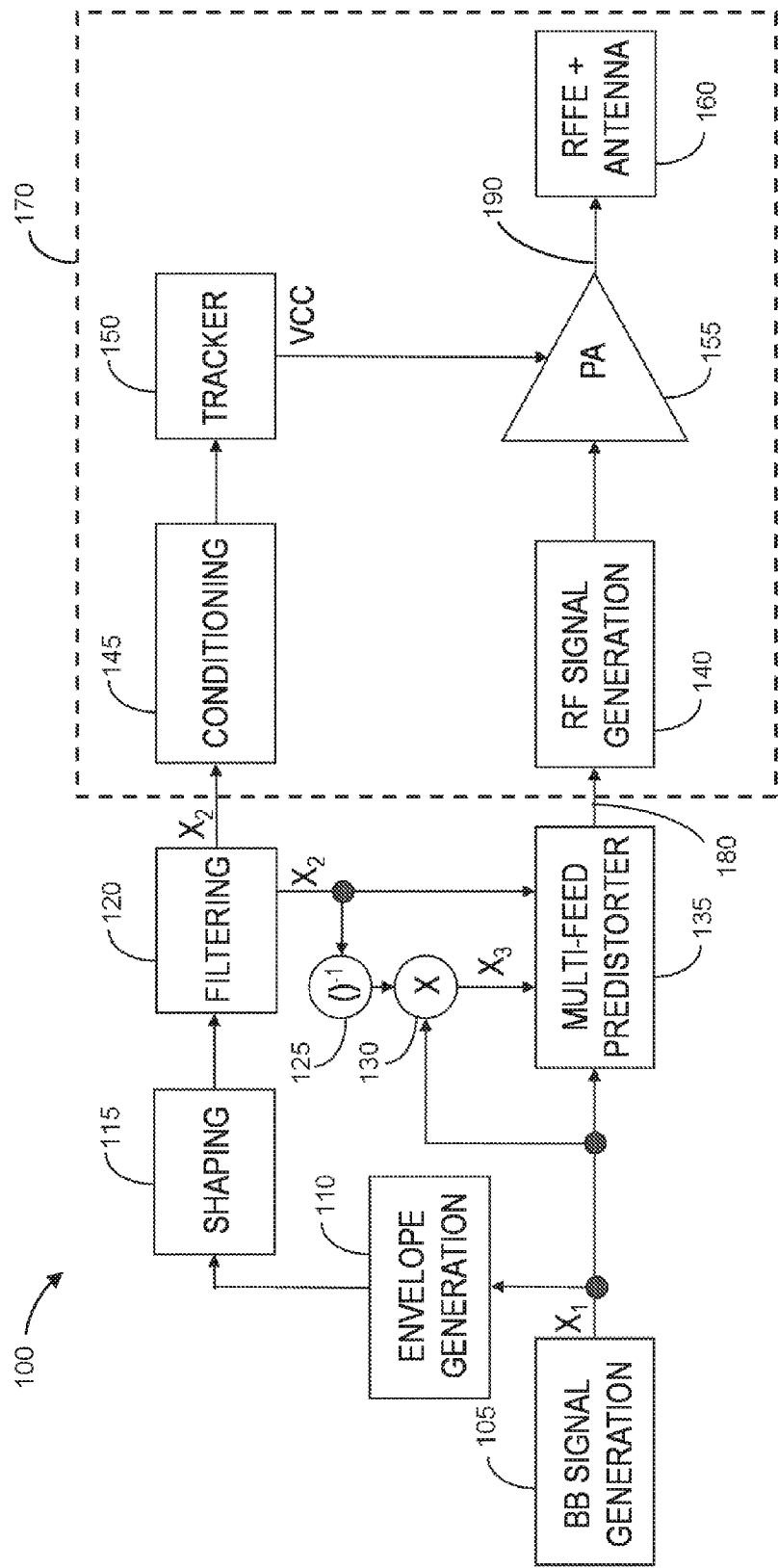
FIG. 1 is a block diagram illustrating an exemplary memory predistortion circuitry coupled with transmitter circuitry having a bandwidth-limited envelope tracking system, in accordance with some embodiments.

As the cellular telephone industry develops new standards for the next generation of cellular telephone technology, the field of envelope tracking faces new challenges. One such new cellular telephone technology standard that is presently being defined is known as 5G NR (New Radio). Commercial 5G NR deployment is expected to begin in the year 2020, but large scale field testing is expected to begin in the year 2017. LTE advanced or 5G modulation schemes may feature higher bandwidth and more complex modulation schemes in the uplink than prior standards. The new more complex modulation schemes in the uplink may include higher peak-to-average-power ratio (PAPR) than the modulation schemes of prior standards. Mobile stations or user equipment may be expected to support 200 MHz aggregated bandwidth (e.g., 2×100 MHz) or even higher, and advanced uplink modulation schemes may include an evolved single-carrier frequency-division multiple access (SC-FDMA) scheme (e.g., 256-QAM (quadrature amplitude modulation)) and possibly an orthogonal frequency-division multiplexing (OFDM) scheme such as that currently used for a downlink modulation scheme in the present LTE standard.

Modulation schemes having a high PAPR imply a low PA efficiency when operating in Average Power Tracking (APT) mode. In the APT mode, the PA circuitry may receive its power supply voltage from a DC-DC converter that adjusts the converter's output voltage based on the average output power target within a time interval, e.g., a transmission slot. Low PA efficiency may be caused by large PA voltage headroom to prevent RF voltage clipping and subsequent degradation of the PA linearity characteristics, e.g., adjacent channel leakage ratio (ACLR) and error vector magnitude (EVM). For example, for a PAPR of 11 dB, PA voltage headroom may be about 9 dB, resulting in about 2 dB of peak power clipping. The PA efficiency degradation due to PA supply voltage headroom may be calculated as about $10^{(-headroom/20)}$, where headroom is measured in dB. For PA circuitry with a peak efficiency of 60% and 9 dB of voltage headroom, the PA efficiency may drop to below 21%. In contrast, for a 3G Reference Measurement Channel (RMC12.2 voice signal standard), the PA efficiency may be about 45% for a PA peak efficiency of 60%. A lower PA efficiency may cause high battery consumption and excessive heat dissipation in a mobile device. Higher battery consumption may lead to decreased operation time of the mobile device, while excessive heat dissipation may lead to a larger and less desirable size and form factor of the mobile device to dissipate the excess heat.

ET may improve PA efficiency by facilitating the PA circuitry to operate close to its peak efficiency relatively independent of the PAPR. The ET DC-DC converter, also known as a tracker, may provide an instantaneous power supply voltage to the PA circuitry that follows the instantaneous envelope of the RF signal being amplified by the PA circuitry. The modulation of the power supply voltage provided to the PA circuitry in turn may modulate the compression point of the PA. To achieve constant gain conditions (e.g., iso-gain), the PA gain compression point may be varied over time by means of the power supply voltage according to the instantaneous value of the envelope of the RF signal such that the PA compressed gain is constant.

Using ET, the PA headroom may be <1 dB. In contrast, the tracker may have a lower efficiency, e.g., about 85%, dependent upon the signal bandwidth, vs. about 95% in APT mode without ET. The overall efficiency of the tracker and PA circuitry may be expressed as the PA efficiency multiplied by the tracker efficiency. At high PAPR, the lower tracker efficiency in ET mode may be overcompensated by the higher PA efficiency, so ET systems may provide superior efficiency for systems with high PAPR.

However, ET systems present challenges due to bandwidth limitations of their trackers. Typical trackers may support a transmit channel bandwidth of 40 MHz, while next generation trackers may be expected to support 60 MHz or 80 MHz signal transmission bandwidths. Beyond 40 MHz, memory predistortion may be applied to a signal to be transmitted in order to compensate for impairments introduced by the trackers. When tracker bandwidth is too small, the PA power supply voltage may only be modulated according to a low pass filtered version of the RF envelope, such that the PA gain compression point is set according to the low pass filtered version of the RF envelope. Thus, the PA gain compression point may not follow the fast portion of the RF envelope outside the tracking bandwidth, thereby causing the PA gain to no longer be constant, and thereby causing the PA to introduce nonlinearities and distortion into the transmitted signal as the PA gain is modulated by the high frequency part of the RF envelope outside the tracker bandwidth via the PA power supply voltage with a gain compression point that is set by the low frequency part of the RF envelope inside the tracker bandwidth High frequency gain ripple introduced by a tracker bandwidth that is too low may include intermodulation (IM) products. The IM products may be compensated by digital memory predistortion if the PA power supply voltage value is known at every time point in the digital memory predistortion computation to estimate the gain compression (e.g., gain ripple) for the high frequency part of the RF envelope outside the tracker bandwidth, because the PA gain compression point depends upon the absolute level of the PA power supply voltage. Because the instantaneous PA supply voltage depends on past modulation symbols as a superposition, the lower the tracker bandwidth, the more past symbol s may be used to calculate the present value of the PA power supply voltage. Therefore, a low tracker bandwidth relative to the channel bandwidth may add a significant memory depth in a digital memory predistortion system, which may be impractical for standard memory predistortion, e.g., based on memory polynomials or a Volterra approach. In an embodiment, these issues may be overcome by a multi-feed predistorter that operates on a scaled replica of the instantaneous PA power supply voltage, a model distortion signal representative of distortion introduced by the transmitter circuitry including the ET circuitry and the PA circuitry, and the baseband signal to be transmitted.

FIG. 1 is a block diagram illustrating an exemplary memory predistortion circuitry 100 coupled with transmitter circuitry 170 having a bandwidth-limited ET system, in accordance with some embodiments. The memory predistortion circuitry 100 may help overcome bandwidth limitations and signal impairments caused by ET circuitry integrated with the transmitter circuitry 170 by recovering the linearity degradations caused by tracker bandwidth limitations. The memory predistortion circuitry 100 may emulate the physical operation of the ET circuitry to capture the linearity degradations caused by the tracker bandwidth limitations.

The transmitter circuitry 170 may include RF signal generation circuitry 140 to generate an RF signal that represents a modulated baseband (BB) signal to be transmitted by the transmitter circuitry 170, and then output the RF signal to PA circuitry 155. The PA circuitry 155 may receive power supply voltage VCC from tracker circuitry 150 of an ET system. The tracker circuitry 150 may include DC-DC converter circuitry that modulates the power supply voltage VCC based on the modulated BB signal to be transmitted by the transmitter circuitry 170 in order to provide an instantaneous power supply voltage that follows the instantaneous envelope of the modulated BB signal to be transmitted. The tracker circuitry 150 may facilitate constant gain conditions (e.g., iso-gain) in the PA circuitry 155 by modifying the compression point of the PA circuitry 155's gain curve by modulating the power supply voltage VCC provided to the PA circuitry 155. As illustrated, the tracker circuitry 150 may modulate the power supply voltage according to a scaled replica signal $X_2$ based on a modulated BB signal $X_1$ after being conditioned by the conditioning circuitry 145. The PA circuitry 155 may amplify the RF signal by a gain k and output an amplified RF signal 190 to RF front end (RFFE) circuitry and antenna 160 for wireless transmission. Note that the different elements included in the transmitter circuitry 170 may be realized by different physical components, or some of the elements may be integrated together. For example, the conditioning circuitry 145 that performs signal conditioning may be included in an RF integrated circuit (RFIC), or may be included in a BB IC in embodiments in which in phase quadrature (IQ) processing and envelope generation are performed in BB. Also, the tracker circuitry 150 and the PA circuitry 155 may be separate front-end (FE) components.

As illustrated in FIG. 1, a baseband (BB) signal generation circuit 105 may generate the modulated BB signal $X_1$ to be transmitted. In various embodiments, the BB signal generation circuit 105 may generate the modulated BB signal $X_1$ according to data provided by a processor over a data bus, and the modulated BB signal $X_1$ may be a representation of the data to be transmitted. The memory predistortion circuitry 100 may be configured to pre-distort the modulated BB signal $X_1$ and generate a predistortion signal 180 as a baseband signal to be output to the transmitter circuitry 170 so that after being distorted by the ET circuitry integrated with the transmitter circuitry 170 (e.g., the PA circuitry 155 and tracker circuitry 150), the BB representation of the amplified RF signal 190 sent to the RFFE circuitry and antenna 160 for transmission may be essentially equal to the gain k of the PA 155 times the modulated BB signal $X_1$. In other words, the memory predistortion circuitry 100 may be configured to add distortions to the modulated BB signal $X_1$ to generate the predistortion signal 180 to be output to the transmitter circuitry 170 in order to compensate for degradations in transmit signal quality due to ET nonlinearities in the transmitter circuitry 170. The distortions added to the modulated BB signal $X_1$ by the memory predistortion circuitry 100 may effectively cancel out the distortions added by the ET circuitry integrated with the transmitter circuitry 170.

Envelope generation circuitry 110 may perform a coordinate rotation digital computer (CORDIC) algorithm on the modulated BB signal $X_1$ to generate an envelope (e.g., magnitude) of the modulated BB signal $X_1$ and output an envelope signal. While CORDIC algorithm may be used to generate the envelope of the modulated BB signal $X_1$, this should not be construed as limiting. In various embodiments, different algorithms and circuitry may be used to generate the envelope of the modulated BB signal $X_1$.

Shaping circuitry 115 may clamp the envelope signal at the low end, e.g., clamp the envelope signal to a constant value when the input envelope signal goes below a predefined threshold level. The shaping circuitry 115 may also add an offset to the envelope signal and/or apply a weighting factor to the envelope signal to scale the envelope signal. Clamping the envelope signal may help to prevent tracking to low values of the envelope signal, which may limit the required tracking bandwidth of the ET circuitry, and may avoid small envelope signal values. In general, the lower the amplitude of the envelope signal, the higher the instantaneous bandwidth of the ET circuitry may be. The shaping circuitry 115 may perform envelope waveform conditioning in a manner similar to that performed in a tracker 150 of the ET circuitry. Signal conditioning of the envelope signal may be performed by the shaping circuitry 115 in preparation for performing the predistortion by the memory predistortion circuitry 100.

Filtering circuitry 120 may perform filtering of the signal conditioned envelope signal received from the shaping circuitry 115. The filtering circuitry 120 may limit the bandwidth of the envelope signal such that the bandwidth becomes smaller than the envelope tracking bandwidth of the ET circuitry. The dominant filtering may therefore be applied in the digital domain and be stable and reproducible. By applying the dominant filtering in the digital domain, the filtering may be less susceptible to manufacturing variations such as part-to-part variations of the tracker circuitry 150 and circuit board layout. The filtering circuitry 120 may output a scaled replica signal $X_2$ that is a scaled replica of a power supply voltage VCC output from tracker circuitry 150 to modulate the PA 155. The memory predistortion circuitry 100 may therefore use the scaled replica signal $X_2$ as a representation of the instantaneous value of the power supply voltage VCC.

The filtering circuitry 120 may introduce distortion into the signal output by the PA circuitry 155, as the PA circuitry 155 is modulated by a signal after passing the filtering circuitry 120. For example, the PA circuitry 155 may be modulated by a high frequency portion of the RF envelope signal that falls into a stop band of a digital filter implemented by the filtering circuitry 120.

A multi-feed predistorter circuitry 135 operates on the modulated BB signal $X_1$ and the scaled replica signal $X_2$ as well as a model distortion signal $X_3$ to output the predistortion signal 180 to the RF signal generation circuitry 140 included in the transmitter circuitry 170. The multi-feed predistorter circuitry 135 may compensate for the distortion introduced into the signal output by the PA circuitry 155 by performing memory polynomial operations on the modulated BB signal $X_1$, the scaled replica signal $X_2$, and the model distortion signal $X_3$ to generate the predistortion signal 180 output to the RF signal generation circuitry 140. Further details of the multi-feed predistorter circuitry 135 are discussed below with reference to FIG. 2.

The model distortion signal $X_3$ may be generated by inverter circuitry 125 that performs a function $1/X_2$ on the scaled replica signal $X_2$, where $X_2$ is a function of the absolute value of the modulated BB signal $X_1$, followed by multiplier circuitry 130 that multiplies the signal output from the inverter circuitry 125 by the modulated BB signal $X_1$. Thus, the model distortion signal $X_3$ may be represented as $X_1 \cdot (1/X_2)$ or $X_1/f(|X_1|)$. The model distortion signal $X_3$ essentially models the distortion introduced by the ET circuitry of the transmitter circuitry 170 when the PA circuitry 155's power supply voltage VCC is not an exact replica of the envelope of the modulated BB signal $X_1$, for example, due to a time delay offset between the power supply voltage VCC and the RF signal that applied to the PA circuitry 155, a time delay variation over frequency, or bandwidth limitations of the power supply voltage VCC. Thus, the model distortion signal $X_3$ may reflect the restoration process in the PA circuitry 155 that is impaired by VCC bandwidth limitations and delay offset between VCC and RF signal.

Figure 2:
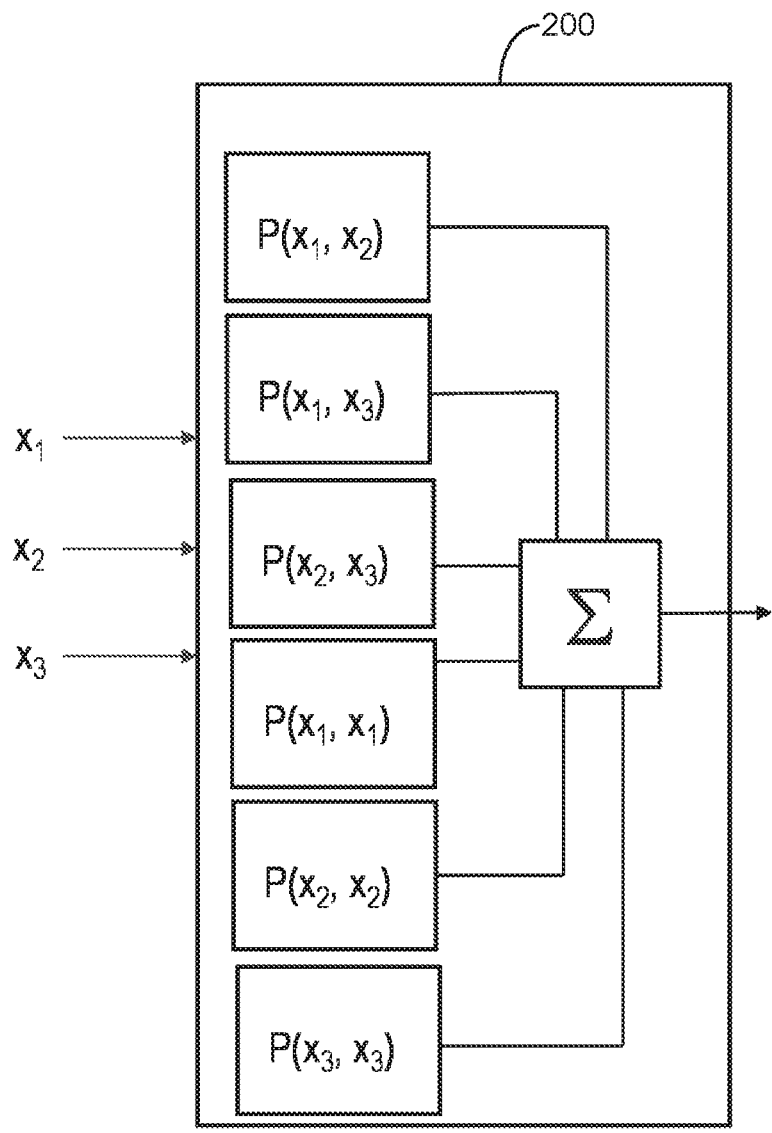
FIG. 2 is a block diagram illustrating multi-feed predistorter circuitry, in accordance with some embodiments.

FIG. 2 is a block diagram illustrating multi-feed predistorter circuitry 200, in accordance with some embodiments. The multi-feed predistorter circuitry 200 may be an embodiment of the multi-feed predistorter circuitry 135 of FIG. 1. The multi-feed predistorter circuitry 200 may implement the following memory polynomial equation (Eq. 1) for each pair of inputs (where the inputs are the modulated BB signal $X_1$, the scaled replica signal $X_2$, and the model distortion signal $X_3$.), and then sum the results of each polynomial equation together by the summer $\Sigma$ before outputting the predistortion signal 180 to the transmitter circuitry 170. The implemented memory polynomial equations may include $P(X_1, X_2)$, $P(X_1, X_3)$, $P(X_2, X_3)$, $P(X_1, X_1)$, $P(X_2, X_2)$, and $P(X_3, X_3)$, each of which may be represented by:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1} \quad \text{(Eq. 1)}$$

where $x_i$ and $x_j$ represent inputs to each of the plurality of memory polynomial circuits, each of $x_i$ and $x_j$ being one of the scaled replica, the distortion signal, and the modulated baseband signal, K describes the maximum order of the memory polynomial, which may be different for each $P(X_i, X_j)$, M is the memory depth of the memory polynomial, n is a discrete time index, and h is the complex weighting of each polynomial. The polynomial coefficients h may be determined by a processor, e.g., according to a self-tuning control mechanism, for example, an indirect learning method for memory polynomial predistorters.

The polynomial equation Eq. 1 is an example polynomial equation, but should not be considered limiting. In various embodiments, other computational processing of $X_1$, $X_2$, and $X_3$ may be used instead.

Each term of the memory polynomial may address one or more different nonlinearities or distortions of the transmitter circuitry 170. The term $P(X_1, X_1)$ may capture distortions due to frequency-dependent loading of the PA circuitry 155, for example, caused by a transmitter filter, and/or amplitude-to-amplitude (AMAM) and amplitude-to-phase (AMPM) distortions due to inappropriate biasing of the PA circuitry 155 or load pulling effects. The term $P(X_2, X_2)$ may address gain dispersion effects in the ET circuitry that depends on an absolute level of the power supply voltage signal VCC. The term $P(X_1, X_3)$ may capture distortions due to the power supply voltage signal VCC that modulates the PA circuitry 155 not being an exact replica of the envelope of the modulated BB signal $X_1$, a time delay variation over frequency, or bandwidth limitations of the power supply voltage VCC.

The multi-feed predistorter circuitry 135 may capture effects caused by limited bandwidth of the tracker circuitry 150, as well as distortions caused by frequency-dependent loading of the PA circuitry 155, ET delay dispersion, ET delay offset, and other nonlinearities and impairments of the PA circuitry 155.

Figure 3:
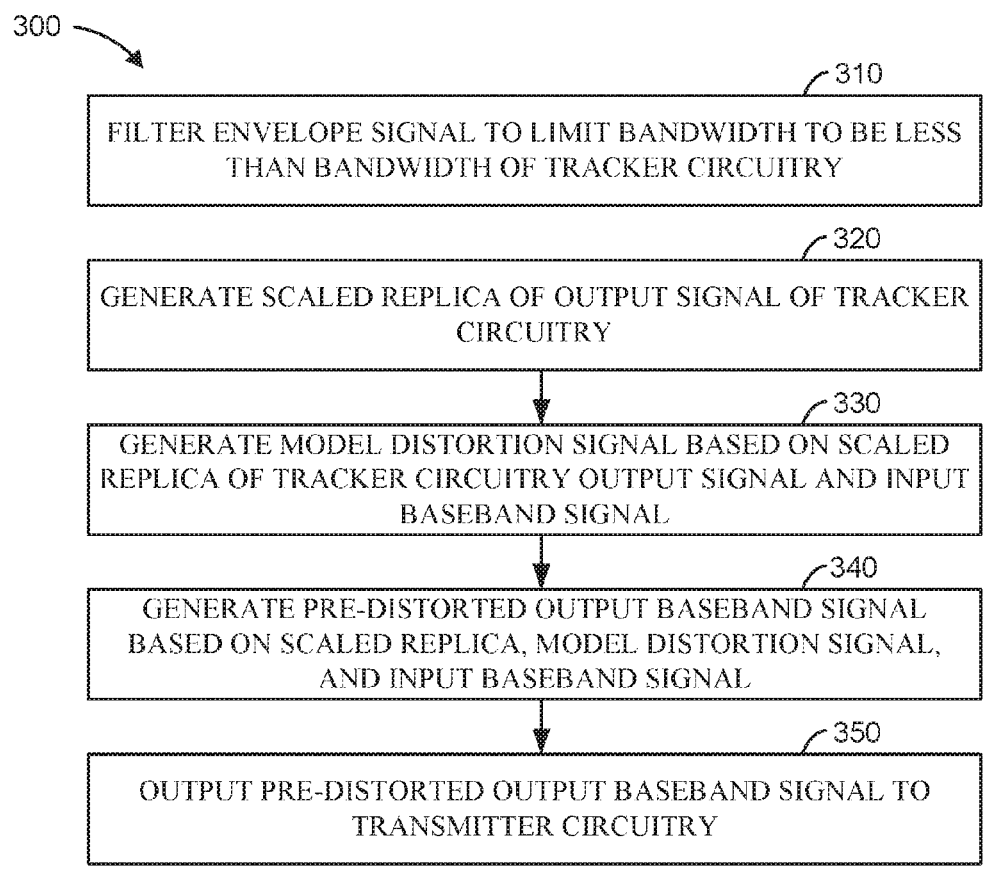
FIG. 3 is a flow chart illustrated a method of memory predistortion in a bandwidth-limited envelope tracking system, in accordance with some embodiments.

FIG. 3 is a flow chart illustrating a method 300 of memory predistortion in a bandwidth-limited envelope tracking (ET) system, in accordance with some embodiments. The memory predistortion may be configured to compensate for nonlinearities in ET. The method 300 may be performed by an apparatus of a wireless device including processing circuitry and memory. The method 300 may be performed by the memory predistortion circuitry 100 coupled with transmitter circuitry 170 having a bandwidth-limited ET system as described above with reference to FIGS. 1 and 2.

In an operation 310, an envelope signal representing an envelope of an input baseband signal may be filtered to limit a bandwidth of the envelope signal to be less than a bandwidth of tracker circuitry. In an embodiment, the filtering may be performed by the filtering circuitry 120 described with reference to FIG. 1. The filtering may limit the bandwidth of the envelope signal such that the bandwidth becomes smaller than the envelope tracking bandwidth of the tracker circuitry in the ET system. The dominant filtering may therefore be applied in the digital domain and be stable and reproducible.

In an operation 320, a scaled replica of an output signal of the tracker circuitry may be generated. The scaled replica may be based on the bandwidth-limited envelope signal. The tracker circuitry's output signal may be input to ET PA circuitry as a variable voltage power supply. The tracker circuitry's output signal may be varied by the tracker circuitry according to the bandwidth-limited envelope signal to increase efficiency of the ET PA circuitry. The scaled replica may be an embodiment of the scaled replica signal $X_2$, the output signal of the tracker circuitry may be an embodiment of the power supply voltage VCC, and the ET PA circuitry may be an embodiment of the PA circuitry 155, all as described above with reference to FIG. 1. The envelope signal may represent an envelope of an input modulated BB signal. The modulated BB signal may be an embodiment of the modulated BB signal $X_1$, as described above with reference to FIG. 1. The amplitude of the bandwidth-limited modulated BB signal may be based on a shaped envelope signal representing a shaped envelope of the modulated BB signal. The envelope signal may be generated by an embodiment of the envelope generation circuitry 110, and the envelope signal may be shaped by an embodiment of the shaping circuitry 115, as described above with reference to FIG. 1.

In an operation 330, a model distortion signal based on the scaled replica and the input modulated BB signal may be generated. The model distortion signal may be based on a ratio of the modulated BB signal and the scaled replica. The model distortion signal may emulate linearity degradation due to tracker bandwidth limitations. The modulated BB signal may be an embodiment of the modulated BB signal $X_1$, the scaled replica may be an embodiment of the scale replica signal $X_2$, and the model distortion signal may be an embodiment of the model distortion signal $X_3$, all as described above with reference to FIG. 1. The model distortion signal may be generated by embodiments of the inverter circuitry 125 and the multiplier circuitry 130 of FIG. 1 according to the formula $X_3 = X_1 \cdot (1/X_2)$ or $X/f(|X_1|)$.

In an operation 340, a pre-distorted output baseband signal based on the scaled replica, the model distortion signal, and the modulated BB signal may be generated. The scaled replica may be an embodiment of the scaled replica signal $X_2$, the model distortion signal may be an embodiment of the model distortion signal $X_3$, the modulated BB signal may be an embodiment of the modulated BB signal $X_1$, and the pre-distorted output baseband signal may be an embodiment of the predistortion signal 180 output by the multi-feed predistorter 135, all as described above with reference to FIG. 1. The pre-distorted output baseband signal may compensate for degradations in transmit signal quality of the transmitter circuitry 170 due to ET nonlinearities and/or other impairments of the PA circuitry 155 of FIG. 1.

The pre-distorted output baseband signal may be generated by computing a plurality of memory polynomial equations operating on pairs of the scaled replica, the model distortion signal, and the modulated baseband signal, and summing results of computing the plurality of memory polynomial equations. In an embodiment, each of the plurality of memory polynomial equations implement the polynomial equation Eq. 1, repeated below for convenience:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1} \quad \text{(Eq. 1)}$$

where $x_i$ and $x_j$ represent inputs to each of the plurality of memory polynomial circuits, each of $x_i$ and $x_j$ being one of the scaled replica, the predistortion signal, and the input modulated baseband signal, $Kx_i,x_j$ describes a maximum order of the polynomial equation, M is a memory depth of the polynomial equation, n is a discrete time index; and h is a complex weighting of each polynomial of the polynomial equation. The polynomial coefficients h may be determined according to processing circuitry, for example, by executing a self-tuning control mechanism, e.g., an indirect learning method for memory polynomial predistorters.

In an operation 350, the pre-distorted output baseband signal may be output to transmitter circuitry. For example, the pre-distorted output baseband signal may be an embodiment of the predistortion signal 180, and an embodiment of the memory predistortion circuitry 100 may output the predistortion signal 180 to an embodiment of the transmitter circuitry 170, as described above with respect to FIG. 1. The pre-distorted output baseband signal may be output to RF signal generation circuitry, e.g., the RF signal generation circuitry 140 of FIG. 1. The RF signal generation circuitry may generate an RF signal that represents the pre-distorted output baseband signal, and then output the RF signal to a power amplifier, e.g., the PA circuitry 155. The PA circuitry 155 may be modulated by a PA power source voltage provided by tracker circuitry of an ET system, e.g., the tracker circuitry 150. The tracker circuitry may modulate the PA power source voltage according to the scaled replica signal (e.g., $X_2$) after being conditioned, for example, by the conditioning circuitry 145. The PA circuitry, e.g., PA circuitry 155, may amplify the RF signal and output the amplified RF signal to RF front end (RFFE) circuitry and antenna, e.g., the RFFE and antenna 160 of FIG. 1, for wireless transmission.

Figure 4:
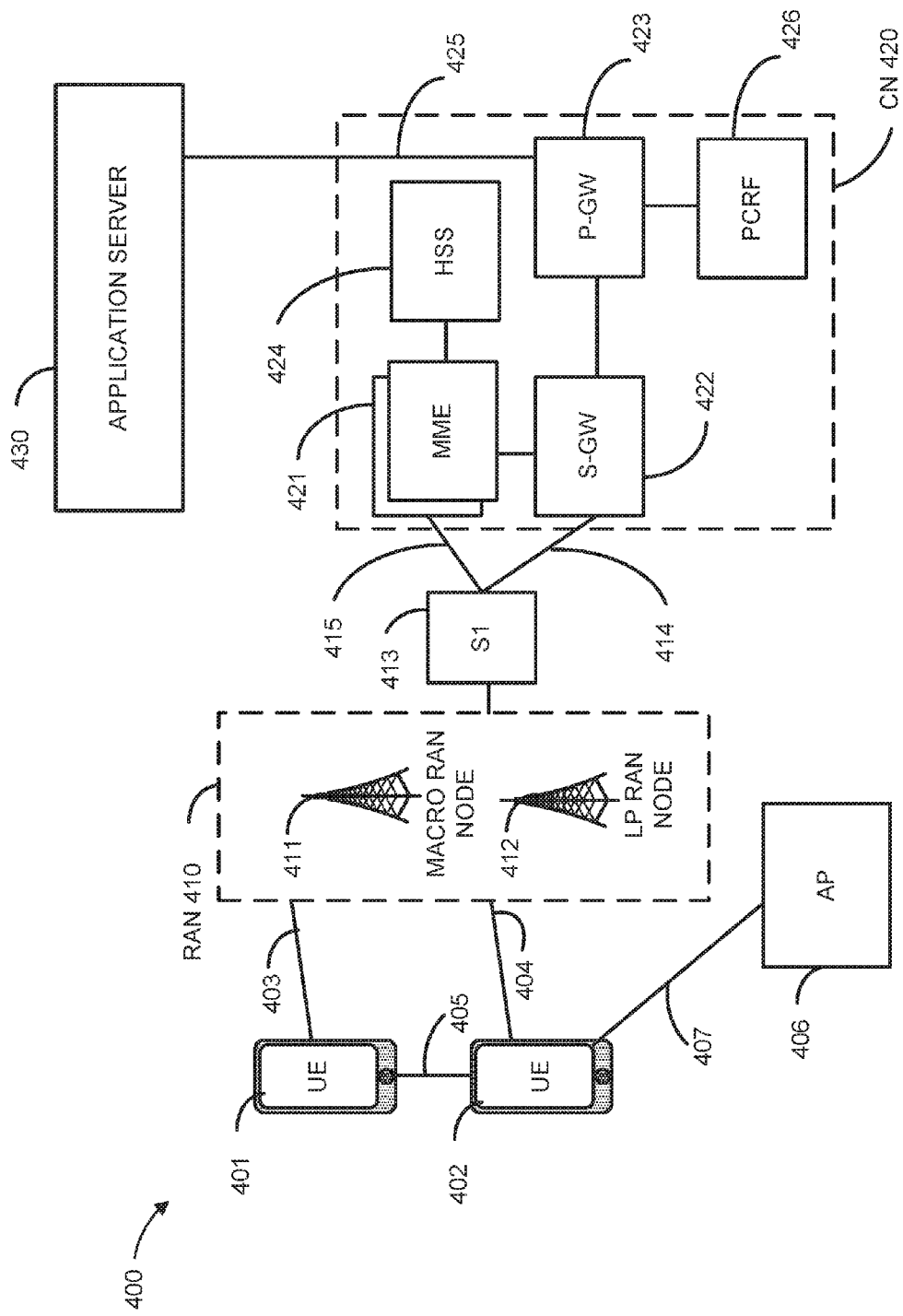
FIG. 4 illustrates an architecture of a system 400 of a network, in accordance with some embodiments.

FIG. 4 illustrates an architecture of a system 400 of a network in accordance with some embodiments. The system 400 is shown to include a user equipment (UE) 401 and a UE 402. The UEs 401 and 402 are illustrated as smartphones (e.g., handheld touchscreen mobile computing devices connectable to one or more cellular networks), but may also comprise any mobile or non-mobile computing device, such as Personal Data Assistants (PDAs), pagers, laptop computers, desktop computers, wireless handsets, or any computing device including a wireless communications interface.

In some embodiments, any of the UEs 401 and 402 can comprise an Internet of Things (IoT) UE, which can comprise a network access layer designed for low-power IoT applications utilizing short-lived UE connections. An IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. The M2M or MTC exchange of data may be a machine-initiated exchange of data. An IoT network describes interconnecting IoT UEs, which may include uniquely identifiable embedded computing devices (within the Internet infrastructure), with short-lived connections. The IoT UEs may execute background applications (e.g., keep-alive messages, status updates, etc.) to facilitate the connections of the IoT network.

The UEs 401 and 402 may be configured to connect, e.g., communicatively couple, with a radio access network (RAN) 410—the RAN 410 may be, for example, an Evolved Universal Mobile Telecommunications System (UMTS) Terrestrial Radio Access Network (E-UTRAN), a Ne5Gen RAN (NG RAN), or some other type of RAN. The UEs 401 and 402 utilize connections 403 and 404, respectively, each of which comprises a physical communications interface or layer (discussed in further detail below); in this example, the connections 403 and 404 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and the like.

In this embodiment, the UEs 401 and 402 may further directly exchange communication data via a ProSe interface 405. The ProSe interface 405 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

The UE 402 is shown to be configured to access an access point (AP) 406 via connection 407. The connection 407 can comprise a local wireless connection, such as a connection consistent with any IEEE 802.11 protocol, wherein the AP 406 would comprise a wireless fidelity (WiFi®) router. In this example, the AP 406 is shown to be connected to the Internet without connecting to the core network of the wireless system (described in further detail below).

The RAN 410 can include one or more access nodes that enable the connections 403 and 404. These access nodes (ANs) can be referred to as base stations (BSs), NodeBs, evolved NodeBs (eNBs), ne5 Generation NodeBs (gNB), RAN nodes, and so forth, and can comprise ground stations (e.g., terrestrial access points) or satellite stations providing coverage within a geographic area (e.g., a cell). The RAN 410 may include one or more RAN nodes for providing macrocells, e.g., macro RAN node 411, and one or more RAN nodes for providing femtocells or picocells (e.g., cells having smaller coverage areas, smaller user capacity, or higher bandwidth compared to macrocells), e.g., low power (LP) RAN node 412.

Any of the RAN nodes 411 and 412 can terminate the air interface protocol and can be the first point of contact for the UEs 401 and 402. In some embodiments, any of the RAN nodes 411 and 412 can fulfill various logical functions for the RAN 410 including, but not limited to, radio network controller (RNC) functions such as radio bearer management, uplink and downlink dynamic radio resource management and data packet scheduling, and mobility management.

In accordance with some embodiments, the UEs 401 and 402 can be configured to communicate using Orthogonal Frequency-Division Multiplexing (OFDM) communication signals with each other or with any of the RAN nodes 411 and 412 over a multicarrier communication channel in accordance various communication techniques, such as, but not limited to, an Orthogonal Frequency-Division Multiple Access (OFDMA) communication technique (e.g., for downlink communications) or a Single Carrier Frequency Division Multiple Access (SC-FDMA) communication technique (e.g., for uplink and ProSe or sidelink communications), although the scope of the embodiments is not limited in this respect. The OFDM signals can comprise a plurality of orthogonal subcarriers.

In some embodiments, a downlink resource grid can be used for downlink transmissions from any of the RAN nodes 411 and 412 to the UEs 401 and 402, while uplink transmissions can utilize similar techniques. The grid can be a time-frequency grid, called a resource grid or time-frequency resource grid, which is the physical resource in the downlink in each slot. Such a time-frequency plane representation is a common practice for OFDM systems, which makes it intuitive for radio resource allocation. Each column and each row of the resource grid corresponds to one OFDM symbol and one OFDM subcarrier, respectively. The duration of the resource grid in the time domain corresponds to one slot in a radio frame. The smallest time-frequency unit in a resource grid is denoted as a resource element. Each resource grid comprises a number of resource blocks, which describe the mapping of certain physical channels to resource elements. Each resource block comprises a collection of resource elements; in the frequency domain, this may represent the smallest quantity of resources that currently can be allocated. There are several different physical downlink channels that are conveyed using such resource blocks.

The physical downlink shared channel (PDSCH) may carry user data and higher-layer signaling to the UEs 401 and 402. The physical downlink control channel (PDCCH) may carry information about the transport format and resource allocations related to the PDSCH channel, among other things. It may also inform the UEs 401 and 402 about the transport format, resource allocation, and H-ARQ (Hybrid Automatic Repeat Request) information related to the uplink shared channel. Typically, downlink scheduling (assigning control and shared channel resource blocks to the UE 102 within a cell) may be performed at any of the RAN nodes 411 and 412 based on channel quality information fed back from any of the UEs 401 and 402. The downlink resource assignment information may be sent on the PDCCH used for (e.g., assigned to) each of the UEs 401 and 402.

The PDCCH may use control channel elements (CCEs) to convey the control information. Before being mapped to resource elements, the PDCCH complex-valued symbol s may first be organized into quadruplets, which may then be permuted using a sub-block interleaver for rate matching. Each PDCCH may be transmitted using one or more of these CCEs, where each CCE may correspond to nine sets of four physical resource elements known as resource element groups (REGs). Four Quadrature Phase Shift Keying (QPSK) symbols may be mapped to each REG. The PDCCH can be transmitted using one or more CCEs, depending on the size of the downlink control information (DCI) and the channel condition. There can be four or more different PDCCH formats defined in LTE with different numbers of CCEs (e.g., aggregation level, L=1, 2, 4, or 8).

Some embodiments may use concepts for resource allocation for control channel information that are an e5ension of the above-described concepts. For example, some embodiments may utilize an enhanced physical downlink control channel (EPDCCH) that uses PDSCH resources for control information transmission. The EPDCCH may be transmitted using one or more enhanced the control channel elements (ECCEs). Similar to above, each ECCE may correspond to nine sets of four physical resource elements known as an enhanced resource element groups (EREGs). An ECCE may have other numbers of EREGs in some situations.

The RAN 410 is shown to be communicatively coupled to a core network (CN) 420—via an S1 interface 413. In embodiments, the CN 420 may be an evolved packet core (EPC) network, a NeSGen Packet Core (NPC) network, or some other type of CN. In this embodiment the S1 interface 413 is split into two parts: the S1-U interface 414, which carries traffic data between the RAN nodes 411 and 412 and the serving gateway (S-GW) 422, and the S1-mobility management entity (MME) interface 415, which is a signaling interface between the RAN nodes 411 and 412 and MMEs 421.

In this embodiment, the CN 420 comprises the MMEs 421, the S-GW 422, the Packet Data Network (PDN) Gateway (P-GW) 423, and a home subscriber server (HSS) 424. The MMEs 421 may be similar in function to the control plane of legacy Serving General Packet Radio Service (GPRS) Support Nodes (SGSN). The MMEs 421 may manage mobility aspects in access such as gateway selection and tracking area list management. The HSS 424 may comprise a database for network users, including subscription-related information to support the network entities' handling of communication sessions. The CN 420 may comprise one or several HSSs 424, depending on the number of mobile subscribers, on the capacity of the equipment, on the organization of the network, etc. For example, the HSS 424 can provide support for routing/roaming, authentication, authorization, naming/addressing resolution, location dependencies, etc.

The S-GW 422 may terminate the S1 interface 413 towards the RAN 410, and routes data packets between the RAN 410 and the CN 420. In addition, the S-GW 422 may be a local mobility anchor point for inter-RAN node handovers and also may provide an anchor for inter-3GPP mobility. Other responsibilities may include lawful intercept, charging, and some policy enforcement.

The P-GW 423 may terminate an SGi interface toward a PDN. The P-GW 423 may route data packets between the EPC network 423 and e5ernal networks such as a network including the application server 430 (alternatively referred to as application function (AF)) via an Internet Protocol (IP) interface 425. Generally, the application server 430 may be an element offering applications that use IP bearer resources with the core network (e.g., UMTS Packet Services (PS) domain, LTE PS data services, etc.). In this embodiment, the P-GW 423 is shown to be communicatively coupled to an application server 430 via an IP communications interface 425. The application server 430 can also be configured to support one or more communication services (e.g., Voice-over-Internet Protocol (VoIP) sessions, PTT sessions, group communication sessions, social networking services, etc.) for the UEs 401 and 402 via the CN 420.

The P-GW 423 may further be a node for policy enforcement and charging data collection. Policy and Charging Enforcement Function (PCRF) 426 is the policy and charging control element of the CN 420. In a non-roaming scenario, there may be a single PCRF in the Home Public Land Mobile Network (HPLMN) associated with a UE's Internet Protocol Connectivity Access Network (IP-CAN) session. In a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). The PCRF 426 may be communicatively coupled to the application server 430 via the P-GW 423. The application server 430 may signal the PCRF 426 to indicate a new service flow and select the appropriate Quality of Service (QoS) and charging parameters. The PCRF 426 may provision this rule into a Policy and Charging Enforcement Function (PCEF) (not shown) with the appropriate traffic flow template (TFT) and QoS class of identifier (QCI), which commences the QoS and charging as specified by the application server 430.

Figure 5:
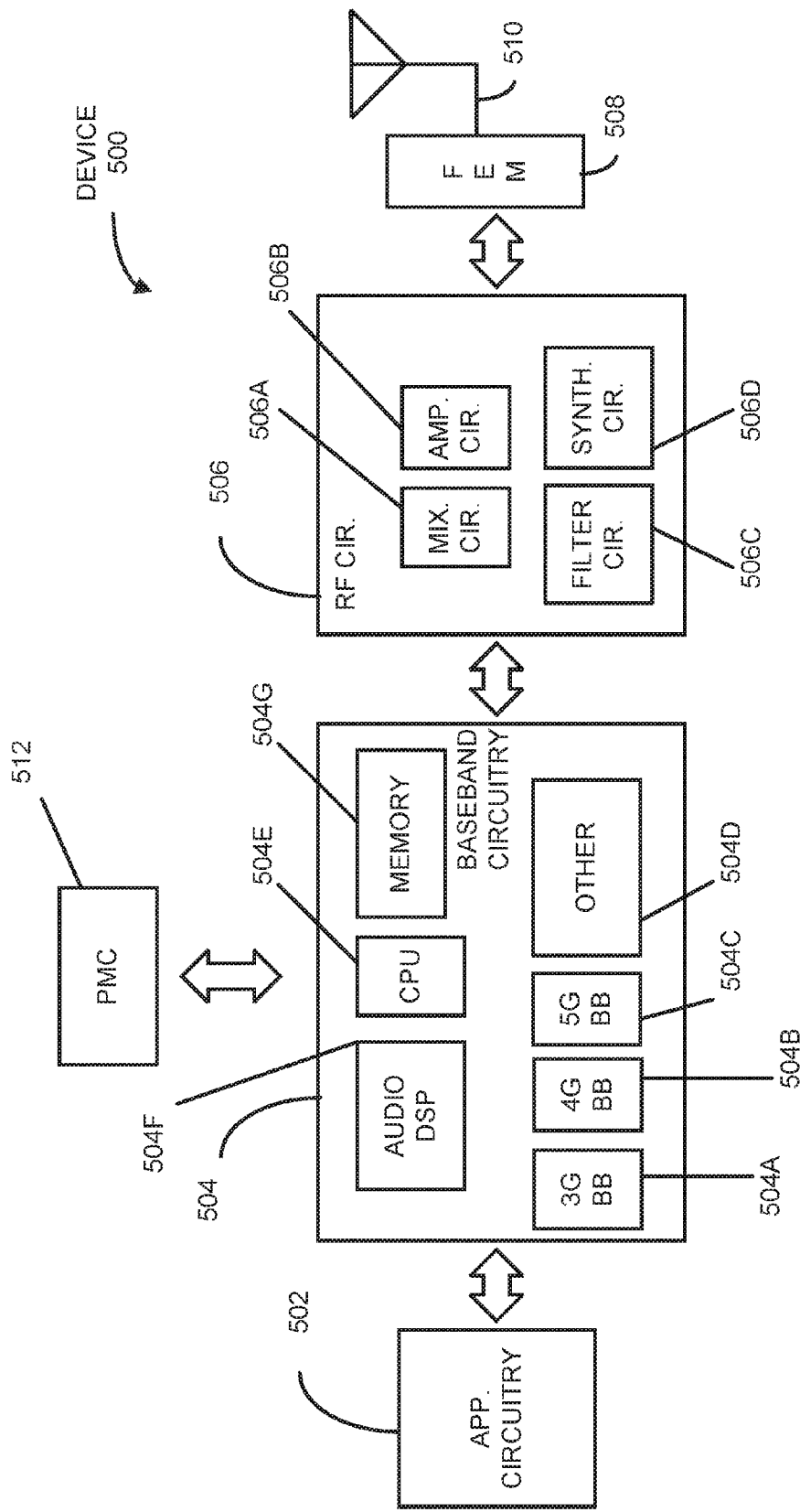
FIG. 5 illustrates example components of a device 500, in accordance with some embodiments.

FIG. 5 illustrates example components of a device 500 in accordance with some embodiments. In some embodiments, the device 500 may include application circuitry 502, baseband circuitry 504, RadioFrequency (RF) circuitry 506, front-end module (FEM) circuitry 508, one or more antennas 510, and power management circuitry (PMC) 512 coupled together at least as shown. The components of the illustrated device 500 may be included in a UE or a RAN node. In some embodiments, the device 500 may include less elements (e.g., a RAN node may not utilize application circuitry 502, and instead include a processor/controller to process IP data received from an EPC). In some embodiments, the device 500 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 502 may include one or more application processors. For example, the application circuitry 502 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device 500. In some embodiments, processors of application circuitry 502 may process IP data packets received from an EPC.

The baseband circuitry 504 may include circuitry such as, but not limited to, one or more single-core or multi-core processors. The baseband circuitry 504 may include one or more baseband processors or control logic to process baseband signals received from a receive signal path of the RF circuitry 506 and to generate baseband signals for a transmit signal path of the RF circuitry 506. Baseband processing circuitry 504 may interface with the application circuitry 502 for generation and processing of the baseband signals and for controlling operations of the RF circuitry 506. For example, in some embodiments, the baseband circuitry 504 may include a third generation (3G) baseband processor 504A, a fourth generation (4G) baseband processor 504B, a fifth generation (5G) baseband processor 504C, or other baseband processor(s) 504D for other existing generations, generations in development or to be developed in the future (e.g., second generation (2G), si5h generation (6G), etc.). The baseband circuitry 504 (e.g., one or more of baseband processors 504A-D) may handle various radio control functions that enable communication with one or more radio networks via the RF circuitry 506. In other embodiments, some or all of the functionality of baseband processors 504A-D may be included in modules stored in the memory 504G and executed via a Central Processing Unit (CPU) 504E. The radio control functions may include, but are not limited to, signal modulation/demodulation, encoding/decoding, radio frequency shifting, etc. In some embodiments, modulation/demodulation circuitry of the baseband circuitry 504 may include Fast-Fourier Transform (FFT), precoding, or constellation mapping/demapping functionality. In some embodiments, encoding/decoding circuitry of the baseband circuitry 504 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 504 may include one or more audio digital signal processor(s) (DSP) 504F. The audio DSP(s) 504F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 504 and the application circuitry 502 may be implemented together such as, for example, on a system on a chip (SOC).

In some embodiments, the baseband circuitry 504 may provide for communication compatible with one or more radio technologies. For example, in some embodiments, the baseband circuitry 504 may support communication with an evolved universal terrestrial radio access network (EU-TRAN) or other wireless metropolitan area networks (WMAN), a wireless local area network (WLAN), a wireless personal area network (WPAN). Embodiments in which the baseband circuitry 504 is configured to support radio communications of more than one wireless protocol may be referred to as multi-mode baseband circuitry.

RF circuitry 506 may enable communication with wireless networks using modulated electromagnetic radiation through a non-solid medium. In various embodiments, the RF circuitry 506 may include switches, filters, amplifiers, etc. to facilitate the communication with the wireless network RF circuitry 506 may include a receive signal path which may include circuitry to down-convert RF signals received from the FEM circuitry 508 and provide baseband signals to the baseband circuitry 504. RF circuitry 506 may also include a transmit signal path which may include circuitry to up-convert baseband signals provided by the baseband circuitry 504 and provide RF output signals to the FEM circuitry 508 for transmission.

In some embodiments, the receive signal path of the RF circuitry 506 may include mixer circuitry 506A, amplifier circuitry 506B and filter circuitry 506C. In some embodiments, the transmit signal path of the RF circuitry 506 may include filter circuitry 506C and mixer circuitry 506A. RF circuitry 506 may also include synthesizer circuitry 506D for synthesizing a frequency for use by the mixer circuitry 506A of the receive signal path and the transmit signal path. In some embodiments, the mixer circuitry 506A of the receive signal path may be configured to down-convert RF signals received from the FEM circuitry 508 based on the synthesized frequency provided by synthesizer circuitry 506D. The amplifier circuitry 506B may be configured to amplify the down-converted signals and the filter circuitry 506C may be a low-pass filter (LPF) or band-pass filter (BPF) configured to remove unwanted signals from the down-converted signals to generate output baseband signals. Output baseband signals may be provided to the baseband circuitry 504 for further processing. In some embodiments, the output baseband signals may be zero-frequency baseband signals, although this is not a requirement. In some embodiments, mixer circuitry 506A of the receive signal path may comprise passive mixers, although the scope of the embodiments is not limited in this respect.

In some embodiments, the mixer circuitry 506A of the transmit signal path may be configured to up-convert input baseband signals based on the synthesized frequency provided by the synthesizer circuitry 506D to generate RF output signals for the FEM circuitry 508. The baseband signals may be provided by the baseband circuitry 504 and may be filtered by filter circuitry 506C.

In some embodiments, the mixer circuitry 506A of the receive signal path and the mixer circuitry 506A of the transmit signal path may include two or more mixers and may be arranged for quadrature downconversion and upconversion, respectively. In some embodiments, the mixer circuitry 506A of the receive signal path and the mixer circuitry 506A of the transmit signal path may include two or more mixers and may be arranged for image rejection (e.g., Hartley image rejection). In some embodiments, the mixer circuitry 506A of the receive signal path and the mixer circuitry 506A may be arranged for direct downconversion and direct upconversion, respectively. In some embodiments, the mixer circuitry 506A of the receive signal path and the mixer circuitry 506A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 506 may include analog-to-digital converter (ADC) and digital-to-analog converter (DAC) circuitry and the baseband circuitry 504 may include a digital baseband interface to communicate with the RF circuitry 506.

In some dual-mode embodiments, a separate radio IC circuitry may be provided for processing signals for each spectrum, although the scope of the embodiments is not limited in this respect.

In some embodiments, the synthesizer circuitry 506D may be a fractional-N synthesizer or a fractional N/N+1 synthesizer, although the scope of the embodiments is not limited in this respect as other types of frequency synthesizers may be suitable. For example, synthesizer circuitry 506D may be a delta-sigma synthesizer, a frequency multiplier, or a synthesizer comprising a phase-locked loop with a frequency divider.

The synthesizer circuitry 506D may be configured to synthesize an output frequency for use by the mixer circuitry 506A of the RF circuitry 506 based on a frequency input and a divider control input. In some embodiments, the synthesizer circuitry 506D may be a fractional N/N+1 synthesizer.

In some embodiments, frequency input may be provided by a voltage controlled oscillator (VCO), although that is not a requirement. Divider control input may be provided by either the baseband circuitry 504 or the applications processor 502 depending on the desired output frequency. In some embodiments, a divider control input (e.g., N) may be determined from a look-up table based on a channel indicated by the applications processor 502.

Synthesizer circuitry 506D of the RF circuitry 506 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 506D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 506 may include an IQ/polar converter.

FEM circuitry 508 may include a receive signal path which may include circuitry configured to operate on RF signals received from one or more antennas 510, amplify the received signals and provide the amplified versions of the received signals to the RF circuitry 506 for further processing. FEM circuitry 508 may also include a transmit signal path which may include circuitry configured to amplify signals for transmission provided by the RF circuitry 506 for transmission by one or more of the one or more antennas 510. In various embodiments, the amplification through the transmit or receive signal paths may be done solely in the RF circuitry 506, solely in the FEM 508, or in both the RF circuitry 506 and the FEM 508.

In some embodiments, the FEM circuitry 508 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 506). The transmit signal path of the FEM circuitry 508 may include a power amplifier (PA) to amplify input RF signals (e.g., provided by RF circuitry 506), and one or more filters to generate RF signals for subsequent transmission (e.g., by one or more of the one or more antennas 510).

In some embodiments, the PMC 512 may manage power provided to the baseband circuitry 504. In particular, the PMC 512 may control power-source selection, voltage scaling, battery charging, or DC-to-DC conversion. The PMC 512 may often be included when the device 500 is capable of being powered by a battery, for example, when the device is included in a UE. The PMC 512 may increase the power conversion efficiency while providing desirable implementation size and heat dissipation characteristics.

While FIG. 5 shows the PMC 512 coupled only with the baseband circuitry 504. However, in other embodiments, the PMC 512 may be additionally or alternatively coupled with, and perform similar power management operations for, other components such as, but not limited to, application circuitry 502, RF circuitry 506, or FEM 508.

In some embodiments, the PMC 512 may control, or otherwise be part of, various power saving mechanisms of the device 500. For example, if the device 500 is in an RRC_Connected state, where it is still connected to the RAN node as it expects to receive traffic shortly, then it may enter a state known as Discontinuous Reception Mode (DRX) after a period of inactivity. During this state, the device 500 may power down for brief intervals of time and thus save power.

If there is no data traffic activity for an e5ended period of time, then the device 500 may transition off to an RRC_Idle state, where it disconnects from the network and does not perform operations such as channel quality feedback, handover, etc. The device 500 goes into a very low power state and it performs paging where again it periodically wakes up to listen to the network and then powers down again. The device 500 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 502 and processors of the baseband circuitry 504 may be used to execute elements of one or more instances of a protocol stack. For example, processors of the baseband circuitry 504, alone or in combination, may be used execute Layer 3, Layer 2, or Layer 1 functionality, while processors of the application circuitry 504 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 6:
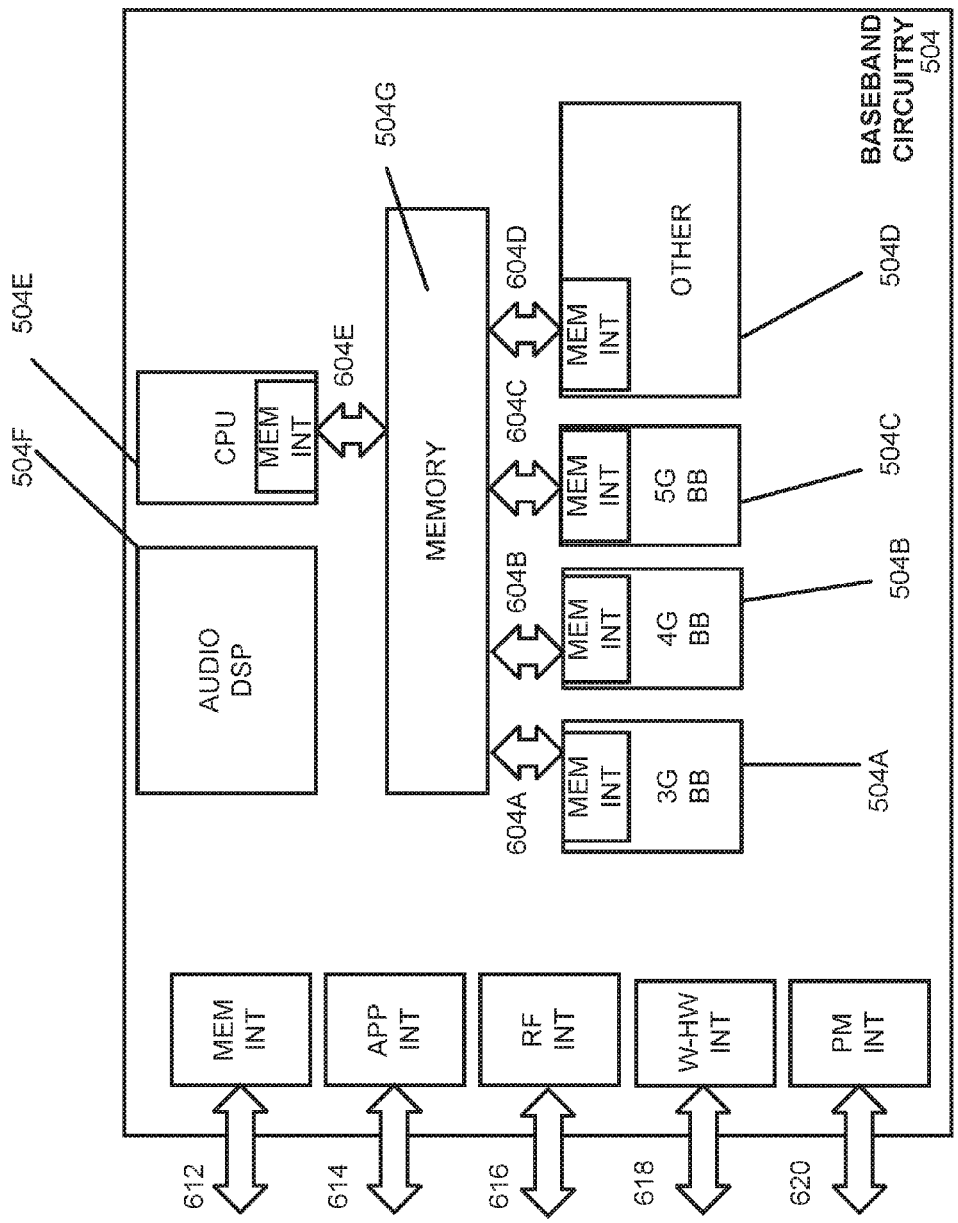
FIG. 6 illustrates example interfaces of baseband circuitry, in accordance with some embodiments.

FIG. 6 illustrates example interfaces of baseband circuitry in accordance with some embodiments. As discussed above, the baseband circuitry 504 of FIG. 5 may comprise processors 504A-504E and a memory 504G utilized by said processors. Each of the processors 504A-504E may include a memory interface, 604A-604E, respectively, to send/receive data to/from the memory 504G.

The baseband circuitry 504 may further include one or more interfaces to communicatively couple to other circuitries/devices, such as a memory interface 612 (e.g., an interface to send/receive data to/from memory e5ernal to the baseband circuitry 504), an application circuitry interface 614 (e.g., an interface to send/receive data to/from the application circuitry 502 of FIG. 5), an RF circuitry interface 616 (e.g., an interface to send/receive data to/from RF circuitry 506 of FIG. 5), a wireless hardware connectivity interface 618 (e.g., an interface to send/receive data to/from Near Field Communication (NFC) components, Bluetooth® components (e.g., Bluetooth® Low Energy), Wi-Fi® components, and other communication components), and a power management interface 620 (e.g., an interface to send/receive power or control signals to/from the PMC 512).

Figure 7:
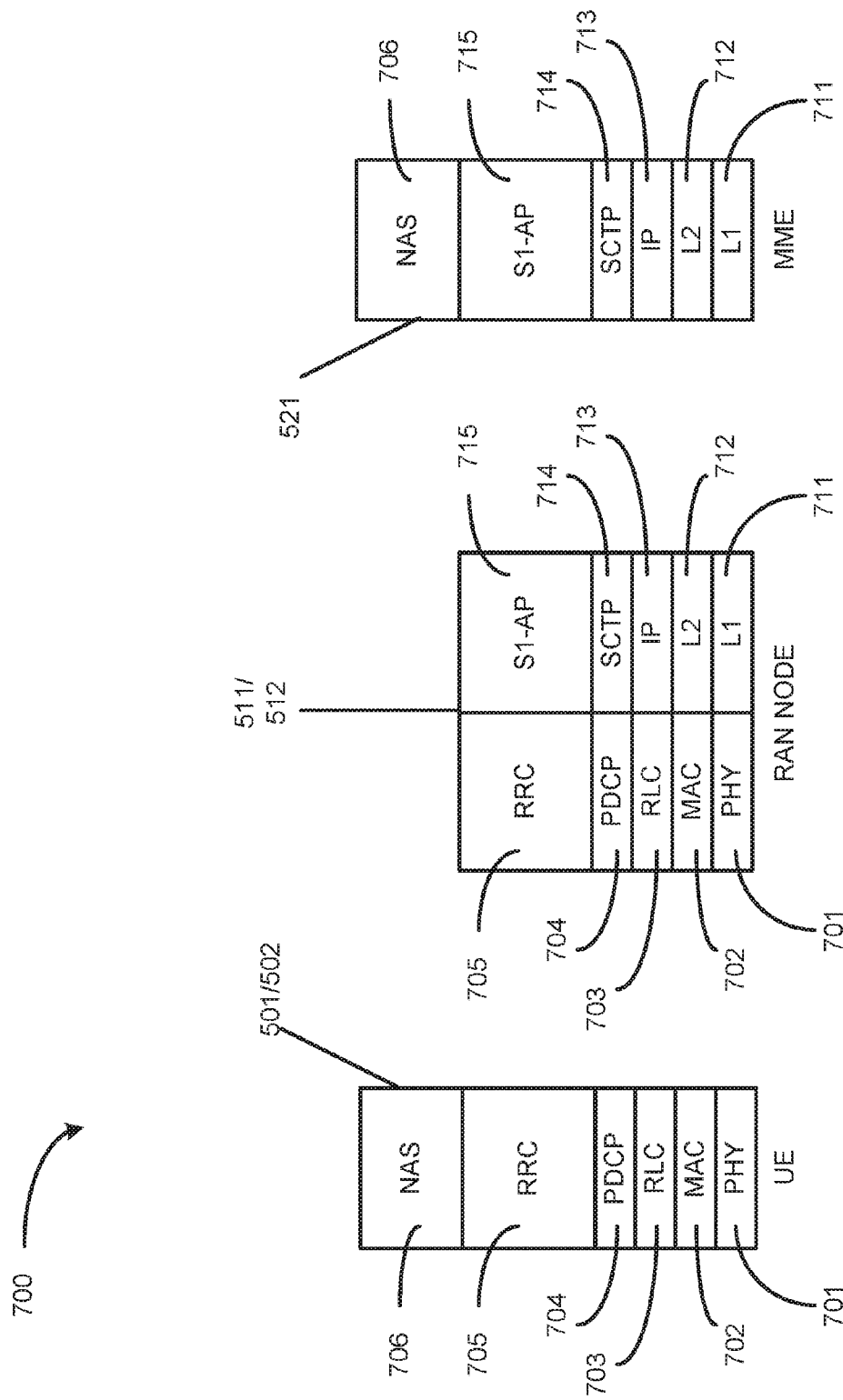
FIG. 7 is an illustration of a control plane protocol stack, in accordance with some embodiments.

FIG. 7 is an illustration of a control plane protocol stack in accordance with some embodiments. In this embodiment, a control plane 700 is shown as a communications protocol stack between the UE 401 (or alternatively, the UE 402), the RAN node 411 (or alternatively, the RAN node 412), and the MME 421.

The PHY layer 701 may transmit or receive information used by the MAC layer 702 over one or more air interfaces. The PHY layer 701 may further perform link adaptation or adaptive modulation and coding (AMC), power control, cell search (e.g., for initial synchronization and handover purposes), and other measurements used by higher layers, such as the RRC layer 705. The PHY layer 701 may still further perform error detection on the transport channels, forward error correction (FEC) coding/decoding of the transport channels, modulation/demodulation of physical channels, interleaving, rate matching, mapping onto physical channels, and Multiple Input Multiple Output (MIMO) antenna processing.

The MAC layer 702 may perform mapping between logical channels and transport channels, multiplexing of MAC service data units (SDUs) from one or more logical channels onto transport blocks (TB) to be delivered to PHY via transport channels, de-multiplexing MAC SDUs to one or more logical channels from transport blocks (TB) delivered from the PHY via transport channels, multiplexing MAC SDUs onto TBs, scheduling information reporting, error correction through hybrid automatic repeat request (HARQ), and logical channel prioritization.

The RLC layer 703 may operate in a plurality of modes of operation, including: Transparent Mode (TM), Unacknowledged Mode (UM), and Acknowledged Mode (AM). The RLC layer 703 may execute transfer of upper layer protocol data units (PDUs), error correction through automatic repeat request (ARQ) for AM data transfers, and concatenation, segmentation and reassembly of RLC SDUs for UM and AM data transfers. The RLC layer 703 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

The PDCP layer 704 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

The main services and functions of the RRC layer 705 may include broadcast of system information (e.g., included in Master Information Blocks (MIBs) or System Information Blocks (SIBs) related to the non-access stratum (NAS)), broadcast of system information related to the access stratum (AS), paging, establishment, maintenance and release of an RRC connection between the UE and E-UTRAN (e.g., RRC connection paging RRC connection establishment, RRC connection modification, and RRC connection release), establishment, configuration, maintenance and release of point to point Radio Bearers, security functions including key management, inter radio access technology (RAT) mobility, and measurement configuration for UE measurement reporting. Said MIBs and SIBs may comprise one or more information elements (IEs), which may each comprise individual data fields or data structures.

The UE 401 and the RAN node 411 may utilize a Uu interface (e.g., an LTE-Uu interface) to exchange control plane data via a protocol stack comprising the PHY layer 701, the MAC layer 702, the RLC layer 703, the PDCP layer 704, and the RRC layer 705.

The non-access stratum (NAS) protocols 706 form the highest stratum of the control plane between the UE 401 and the MME 421. The NAS protocols 706 support the mobility of the UE 401 and the session management procedures to establish and maintain IP connectivity between the UE 401 and the P-GW 423.

The S1 Application Protocol (S1-AP) layer 715 may support the functions of the S1 interface and comprise Elementary Procedures (EPs). An EP is a unit of interaction between the RAN node 411 and the CN 420. The S1-AP layer services may comprise two groups: UE-associated services and non UE-associated services. These services perform functions including, but not limited to: E-UTRAN Radio Access Bearer (E-RAB) management, UE capability indication, mobility, NAS signaling transport, RAN Information Management (RIM), and configuration transfer.

The Stream Control Transmission Protocol (SCTP) layer (alternatively referred to as the SCTP/IP layer) 714 may ensure reliable delivery of signaling messages between the RAN node 411 and the MME 421 based, in part, on the IP protocol, supported by the IP layer 713. The L2 layer 712 and the L1 layer 711 may refer to communication links (e.g., wired or wireless) used by the RAN node and the MME to exchange information.

The RAN node 411 and the MME 421 may utilize an S1-MME interface to exchange control plane data via a protocol stack comprising the L1 layer 711, the L2 layer 712, the IP layer 713, the SCTP layer 714, and the S1-AP layer 715.

Figure 8:
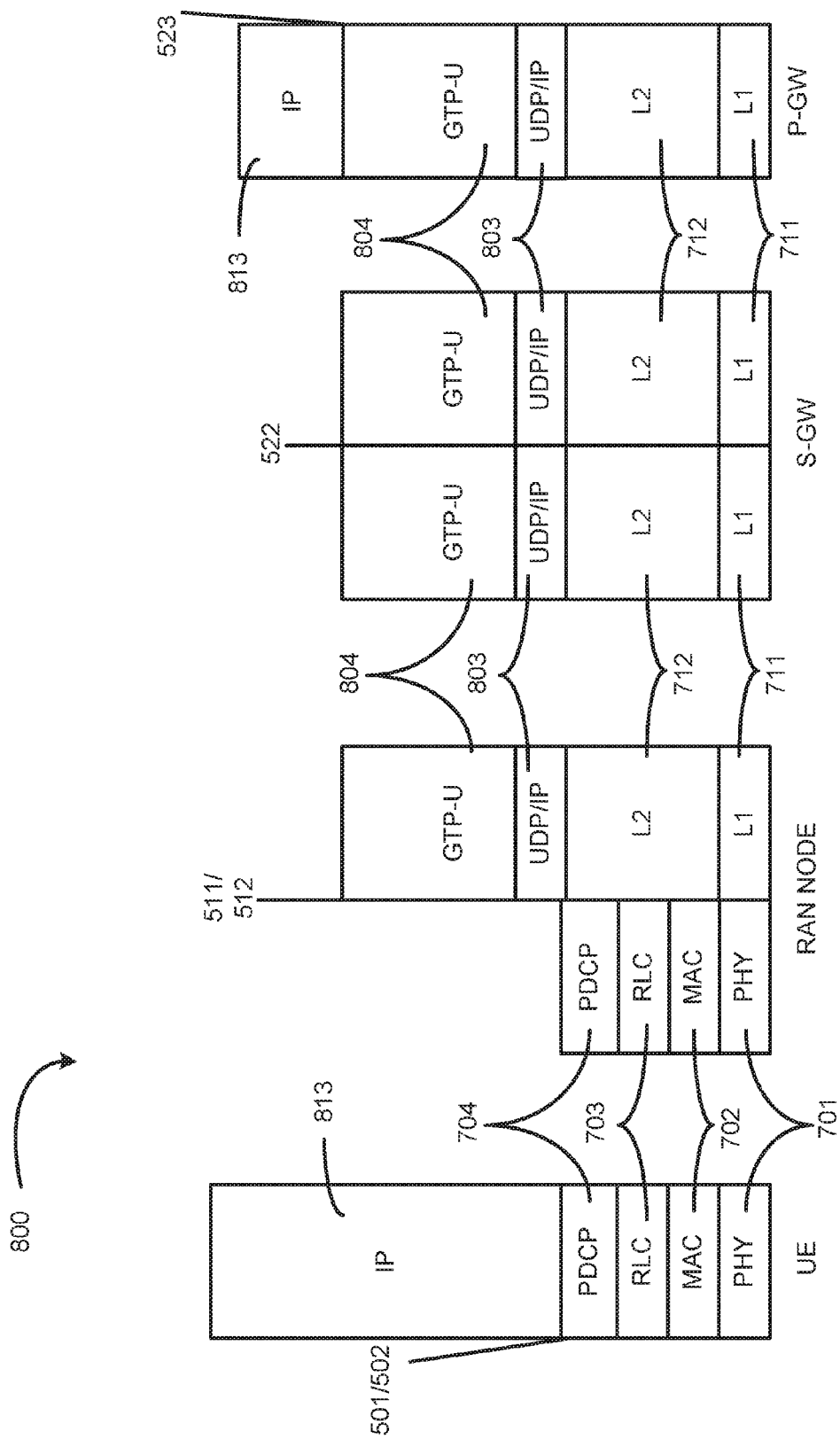
FIG. 8 is an illustration of a user plane protocol stack, in accordance with some embodiments.

FIG. 8 is an illustration of a user plane protocol stack in accordance with some embodiments. In this embodiment, a user plane 800 is shown as a communications protocol stack between the UE 401 (or alternatively, the UE 402), the RAN node 411 (or alternatively, the RAN node 412), the S-GW 422, and the P-GW 423. The user plane 800 may utilize at least some of the same protocol layers as the control plane 700. For example, the UE 401 and the RAN node 411 may utilize a Uu interface (e.g., an LTE-Uu interface) to exchange user plane data via a protocol stack comprising the PHY layer 701, the MAC layer 702, the RLC layer 703, the PDCP layer 704.

The General Packet Radio Service (GPRS) Tunneling Protocol for the user plane (GTP-U) layer 804 may be used for carrying user data within the GPRS core network and between the radio access network and the core network. The user data transported can be packets in any of IPv4, IPv6, or PPP formats, for example. The UDP and IP security (UDP/IP) layer 803 may provide checksums for data integrity, port numbers for addressing different functions at the source and destination, and encryption and authentication on the selected data flows. The RAN node 411 and the S-GW 422 may utilize an S1-U interface to exchange user plane data via a protocol stack comprising the L1 layer 711, the L2 layer 712, the UDP/IP layer 803, and the GTP-U layer 804. The S-GW 422 and the P-GW 423 may utilize an S5/S8a interface to exchange user plane data via a protocol stack comprising the L1 layer 711, the L2 layer 712, the UDP/IP layer 803, and the GTP-U layer 804. As discussed above with respect to FIG. 7, NAS protocols support the mobility of the UE 401 and the session management procedures to establish and maintain IP connectivity between the UE 401 and the P-GW 423.

Figure 9:
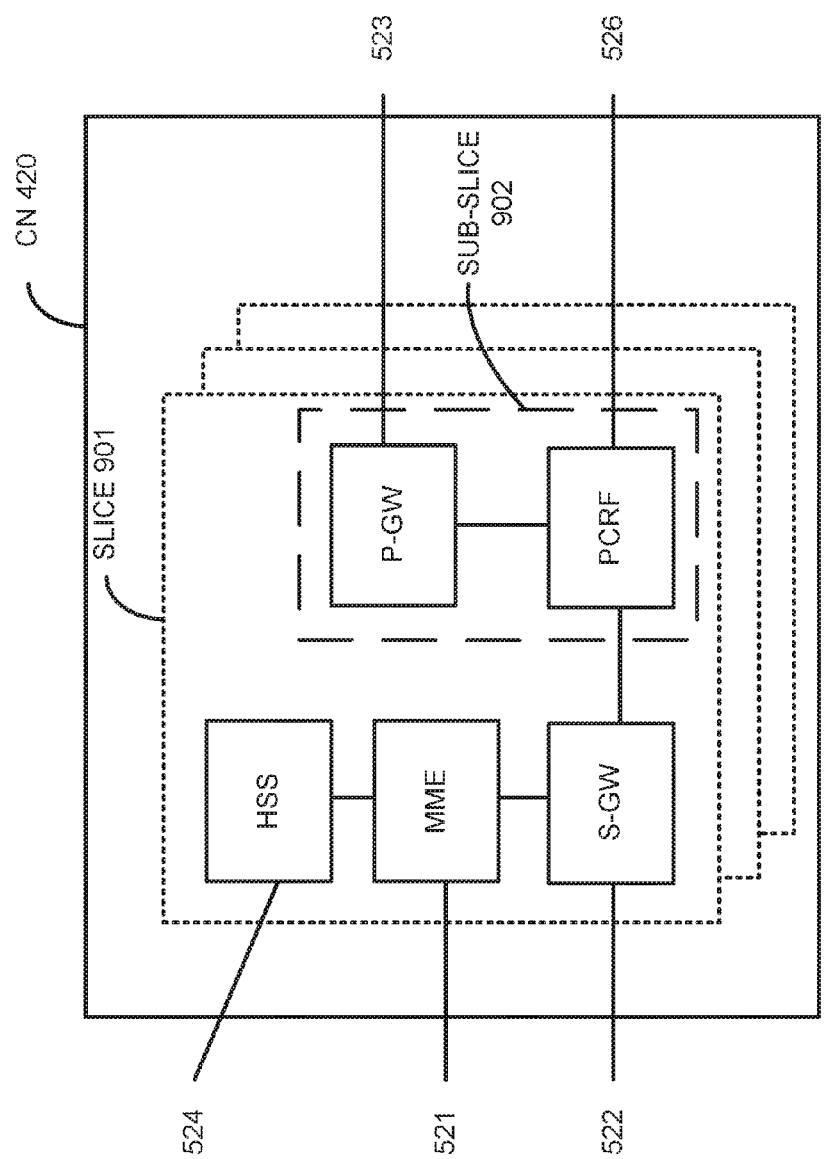
FIG. 9 illustrates components of a core network, in accordance with some embodiments.

FIG. 9 illustrates components of a core network in accordance with some embodiments. The components of the CN 420 may be implemented in one physical node or separate physical nodes including components to read and execute instructions from a machine-readable or computer-readable medium (e.g., a non-transitory machine-readable storage medium). In some embodiments, Network Functions Virtualization (NFV) is utilized to virtualize any or all of the above described network node functions via executable instructions stored in one or more computer readable storage mediums (described in further detail below). A logical instantiation of the CN 420 may be referred to as a network slice 901. A logical instantiation of a portion of the CN 420 may be referred to as a network sub-slice 902 (e.g., the network sub-slice 902 is shown to include the PGW 423 and the PCRF 426).

NFV architectures and infrastructures may be used to virtualize one or more network functions, alternatively performed by proprietary hardware, onto physical resources comprising a combination of industry-standard server hardware, storage hardware, or switches. In other words, NFV systems can be used to execute virtual or reconfigurable implementations of one or more EPC components/functions.

Figure 10:
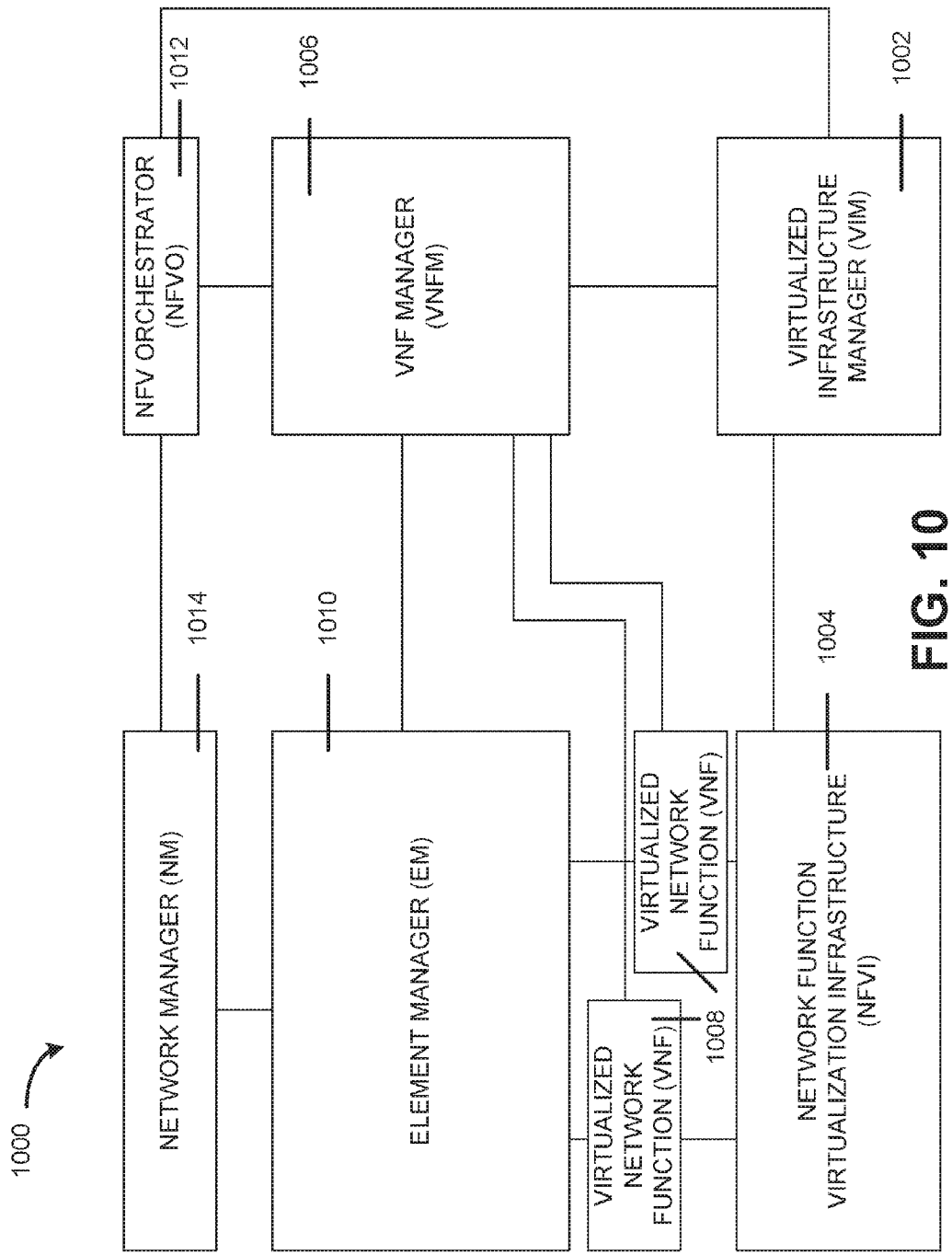
FIG. 10 is a block diagram illustrating components, according to some example embodiments, of a system 1000 to support NFV.

FIG. 10 is a block diagram illustrating components, according to some example embodiments, of a system 1000 to support NFV. The system 1000 is illustrated as including a virtualized infrastructure manager (VIM) 1002, a network function virtualization infrastructure (NFVI) 1004, a VNF manager (VNFM) 1006, virtualized network functions (VNFs) 1008, an element manager (EM) 1010, an NFV Orchestrator (NFVO) 1012, and a network manager (NM) 1014.

The VIM 1002 manages the resources of the NFVI 1004. The NFVI 1004 can include physical or virtual resources and applications (including hypervisors) used to execute the system 1000. The VIM 1002 may manage the life cycle of virtual resources with the NFVI 1004 (e.g., creation, maintenance, and tear down of virtual machines (VMs) associated with one or more physical resources), track VM instances, track performance, fault and security of VM instances and associated physical resources, and expose VM instances and associated physical resources to other management systems.

The VNFM 1006 may manage the VNFs 1008. The VNFs 1008 may be used to execute EPC components/functions. The VNFM 1006 may manage the life cycle of the VNFs 1008 and track performance, fault and security of the virtual aspects of VNFs 1008. The EM 1010 may track the performance, fault and security of the functional aspects of VNFs 1008. The tracking data from the VNFM 1006 and the EM 1010 may comprise, for example, performance measurement (PM) data used by the VIM 1002 or the NFVI 1004. Both the VNFM 1006 and the EM 1010 can scale up/down the quantity of VNFs of the system 1000.

The NFVO 1012 may coordinate, authorize, release and engage resources of the NFVI 1004 in order to provide the requested service (e.g., to execute an EPC function, component, or slice). The NM 1014 may provide a package of end-user functions with the responsibility for the management of a network, which may include network elements with VNFs, non-virtualized network functions, or both (management of the VNFs may occur via the EM 1010).

Figure 11:
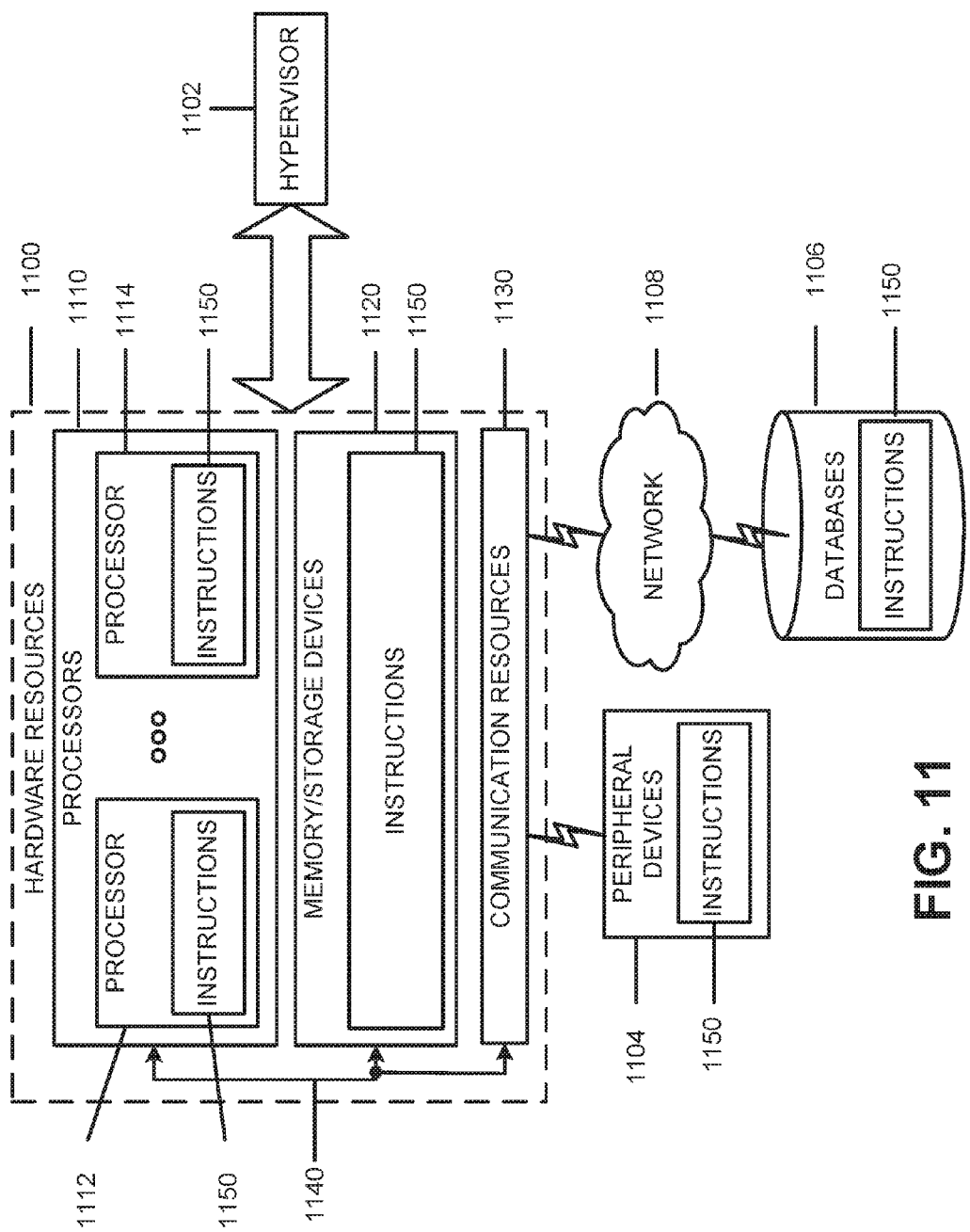
FIG. 11 is a block diagram illustrating components, according to some example embodiments, able to read instructions from a machine-readable or computer-readable medium (e.g., a non-transitory machine-readable storage medium) and perform any one or more of the methodologies discussed herein.

FIG. 11 is a block diagram illustrating components, according to some example embodiments, able to read instructions from a machine-readable or computer-readable medium (e.g., a non-transitory machine-readable storage medium) and perform any one or more of the methodologies discussed herein. Specifically, FIG. 11 shows a diagrammatic representation of hardware resources 1100 including one or more processors (or processor cores) 1110, one or more memory/storage devices 1120, and one or more communication resources 1130, each of which may be communicatively coupled via a bus 1140. For embodiments where node virtualization (e.g., NFV) is utilized, a hypervisor 1102 may be executed to provide an execution environment for one or more network slices/sub-slices to utilize the hardware resources 1100

The processors 1110 (e.g., a central processing unit (CPU), a reduced instruction set computing (RISC) processor, a complex instruction set computing (CISC) processor, a graphics processing unit (GPU), a digital signal processor (DSP) such as a baseband processor, an application specific integrated circuit (ASIC), a radio-frequency integrated circuit (RFIC), another processor, or any suitable combination thereof) may include, for example, a processor 1112 and a processor 1114.

The memory/storage devices 1120 may include main memory, disk storage, or any suitable combination thereof. The memory/storage devices 1120 may include, but are not limited to any type of volatile or non-volatile memory such as dynamic random access memory (DRAM), static random-access memory (SRAM), erasable programmable read-only memory (EPROM), electrically erasable programmable read-only memory (EEPROM), Flash memory, solid-state storage, etc.

The communication resources 1130 may include interconnection or network interface components or other suitable devices to communicate with one or more peripheral devices 1104 or one or more databases 1106 via a network 1108. For example, the communication resources 1130 may include wired communication components (e.g., for coupling via a Universal Serial Bus (USB)), cellular communication components, NFC components, Bluetooth® components (e.g., Bluetooth® Low Energy), Wi-Fi® components, and other communication components.

Instructions 1150 may comprise software, a program, an application, an applet, an app, or other executable code for causing at least any of the processors 1110 to perform any one or more of the methodologies discussed herein. The instructions 1150 may reside, completely or partially, within at least one of the processors 1110 (e.g., within the processor's cache memory), the memory/storage devices 1120, or any suitable combination thereof. Furthermore, any portion of the instructions 1150 may be transferred to the hardware resources 1100 from any combination of the peripheral devices 1104 or the databases 1106. Accordingly, the memory of processors 1110, the memory/storage devices 1120, the peripheral devices 1104, and the databases 1106 are examples of computer-readable and machine-readable media.

It should be noted that embodiments are not limited to the operations, phases, frames, signals and/or other elements shown in the FIGS. 1-11. Some embodiments may not necessarily include all operations, phases, frames, signals and/or other elements shown. Some embodiments may include one or more additional operations, phases, frames, signals and/or other elements. One or more operations may be optional, in some embodiments.

Example 1 is an apparatus of a wireless device, the apparatus configured to compensate for nonlinearities in envelope tracking (ET), the apparatus comprising: memory; and processing circuitry, configured to: filter an envelope signal representing an envelope of an input baseband signal to limit a bandwidth of the envelope signal to be less than a bandwidth of tracker circuitry; generate a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generate a model distortion signal based on the scaled replica and the input baseband signal, the model distortion signal emulating ET linearity degradation; generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and output the output baseband signal to transmitter circuitry to be converted to an RF signal for transmission by the transmitter circuitry.

In Example 2, the subject matter of Example 1 optionally includes wherein the ET linearity degradation is due to tracker bandwidth limitations.

In Example 3, the subject matter of any one or more of Examples 1-2 optionally include wherein the ET linearity degradation is due to ET delay offset errors.

In Example 4, the subject matter of any one or more of Examples 1-3 optionally include wherein the processing circuitry is further configured to: generate the envelope signal from the input baseband signal; and shape the envelope signal; wherein the shaped envelope signal is filtered and the scaled replica is generated based on the filtered shaped envelope signal.

In Example 5, the subject matter of any one or more of Examples 1-4 optionally include wherein the model distortion signal is based on a ratio of the input baseband signal and the scaled replica.

In Example 6, the subject matter of any one or more of Examples 1-5 optionally include wherein the processing circuitry is further configured to invert the scaled replica and multiply the input baseband signal by the inverted scaled replica to generate the model distortion signal.

In Example 7, the subject matter of any one or more of Examples 1-6 optionally include wherein the processing circuitry is further configured to: compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and sum results of computing the plurality of memory polynomial equations to generate the output baseband signal.

In Example 8, the subject matter of Example 7 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 9, the subject matter of Example 8 optionally includes wherein the processing circuitry is further configured to determine the complex weighting of each polynomial of the polynomial equation by indirect learning.

Example 10 is a method of compensating envelope tracking (ET) nonlinearities in a wireless device, the method comprising: filtering an envelope signal representing an envelope of an input baseband signal to limit a bandwidth of the envelope signal to be less than a bandwidth of tracker circuitry; generating a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generating a model distortion signal based on the scaled replica and the input baseband signal, the model distortion signal emulating ET linearity degradation; generating an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and outputting the output baseband signal to transmitter circuitry to be converted to an RF signal for transmission by the transmitter circuitry.

In Example 11, the subject matter of Example 10 optionally includes wherein the ET linearity degradation is due to tracker bandwidth limitations.

In Example 12, the subject matter of any one or more of Examples 10-11 optionally include wherein the ET linearity degradation is due to ET delay offset errors.

In Example 13, the subject matter of any one or more of Examples 10-12 optionally include generating the envelope signal from the input baseband signal; and shaping the envelope signal; wherein the shaped envelope signal is filtered and the scaled replica is generated based on the filtered shaped envelope signal.

In Example 14, the subject matter of any one or more of Examples 10-13 optionally include wherein generating the model distortion signal comprises: inverting the scaled replica; and multiplying the input baseband signal by the inverted scaled replica to generate the model distortion signal.

In Example 15, the subject matter of any one or more of Examples 10-14 optionally include wherein generating the output baseband signal comprises: computing a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and summing outputs of the plurality of memory polynomial equations to generate the output baseband signal.

In Example 16, the subject matter of Example 15 optionally includes wherein each of the plurality of memory polynomial equations is described by:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index, and h is a complex weighting of each polynomial of the polynomial equation.

In Example 17, the subject matter of Example 16 optionally includes performing indirect learning to determine the complex weighting of each polynomial of the polynomial equation.

In Example 18, the subject matter of any one or more of Examples 10-17 optionally include wherein the model distortion signal is based on a ratio of the input baseband signal and the scaled replica.

Example 19 is a non-transitory computer-readable storage medium that stores instructions for execution by one or more processors of a wireless device, to perform operations for compensating for nonlinearities in envelope tracking (ET), the operations to configure the one or more processors to: filter an envelope signal representing an envelope of an input baseband signal to limit a bandwidth of the envelope signal to be less than a bandwidth of tracker circuitry; generate a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generate a model distortion signal based on the scaled replica and the input baseband signal, the model distortion signal emulating ET linearity degradation; generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and output the output baseband signal to transmitter circuitry to be converted to an RF signal for transmission by the transmitter circuitry.

In Example 20, the subject matter of Example 19 optionally includes wherein the ET linearity degradation is due to tracker bandwidth limitations.

In Example 21, the subject matter of any one or more of Examples 19-20 optionally include wherein the ET linearity degradation is due to ET delay offset errors.

In Example 22, the subject matter of any one or more of Examples 19-21 optionally include wherein the operations further comprise operations to configure the one or more processors to: generate the envelope signal from the input baseband signal; and shape the envelope signal; wherein the shaped envelope signal is filtered and the scaled replica is generated based on the filtered shaped envelope signal.

In Example 23, the subject matter of any one or more of Examples 19-22 optionally include wherein the model distortion signal is based on a ratio of the input baseband signal and the scaled replica.

In Example 24, the subject matter of any one or more of Examples 19-23 optionally include wherein the operations to configure the one or more processors to generate the model distortion signal further include operations to configure the one or more processors to: invert the scaled replica; and multiply the input baseband signal by the inverted scaled replica to generate the model distortion signal.

In Example 25, the subject matter of any one or more of Examples 19-24 optionally include wherein the operations to configure the one or more processors to generate the output baseband signal further include operations to configure the one or more processors to: compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and sum results of computing the plurality of memory polynomial equations to generate the output baseband signal.

In Example 26, the subject matter of Example 25 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 27, the subject matter of Example 26 optionally includes operations to configure the one or more processors to perform indirect learning to determine the complex weighting of each polynomial of the polynomial equation.

Example 28 is an apparatus of a wireless device, the apparatus configured to compensate for nonlinearities in envelope tracking (ET), the apparatus comprising: memory means; processing means coupled to the memory means; means for filtering an envelope signal representing an envelope of an input baseband signal to limit a bandwidth of the envelope signal to be less than a bandwidth of tracker circuitry; means for generating a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; means for generating a model distortion signal based on the scaled replica and the input baseband signal, the model distortion signal emulating ET linearity degradation; means for generating an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and means for outputting the output baseband signal to transmitter circuitry to be converted to an RF signal for transmission by the transmitter circuitry.

In Example 29, the subject matter of Example 28 optionally includes wherein the ET linearity degradation is due to tracker bandwidth limitations.

In Example 30, the subject matter of any one or more of Examples 28-29 optionally include wherein the ET linearity degradation is due to ET delay offset errors.

In Example 31, the subject matter of any one or more of Examples 28-30 optionally include means for generating the envelope signal from the input baseband signal; and means for shaping the envelope signal; wherein the shaped envelope signal is filtered and the scaled replica is generated based on the filtered shaped envelope signal.

In Example 32, the subject matter of any one or more of Examples 28-31 optionally include wherein the means for generating the model distortion signal comprises: means for inverting the scaled replica; and means for multiplying the input baseband signal by the inverted scaled replica to generate the model distortion signal.

In Example 33, the subject matter of any one or more of Examples 28-32 optionally include wherein the means for generating the output baseband signal comprises: means for computing a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself, and means for summing outputs of the plurality of memory polynomial equations to generate the output baseband signal.

In Example 34, the subject matter of Example 33 optionally includes wherein each of the plurality of memory polynomial equations is described by:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 35, the subject matter of Example 34 optionally includes performing indirect learning to determine the complex weighting of each polynomial of the polynomial equation.

In Example 36, the subject matter of any one or more of Examples 28-35 optionally include wherein the model distortion signal is based on a ratio of the input baseband signal and the scaled replica.

Example 37 is an apparatus of a wireless device, the apparatus configured to compensate for nonlinearities in envelope tracking (ET), the apparatus comprising memory; and processing circuitry, configured to: generate an input baseband signal; generate an envelope signal from the input baseband signal; shape the envelope signal; filter the shaped envelope signal to limit a bandwidth of the envelope signal to be less than a bandwidth of tracker circuitry; generate a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generate a model distortion signal as a ratio of the input baseband signal and the scaled replica, the model distortion signal emulating ET linearity degradation; generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; generate a radio frequency (RF) signal based on the output baseband signal; amplify the RF signal by a power amplifier having an input voltage modulated by tracker circuitry based on a conditioned representation of the scaled replica; and transmit the RF signal by RF front end circuitry and antenna.

In Example 38, the subject matter of Example 37 optionally includes wherein the ET linearity degradation is due to tracker bandwidth limitations.

In Example 39, the subject matter of any one or more of Examples 37-38 optionally include wherein the ET linearity degradation is due to ET delay offset errors.

In Example 40, the subject matter of any one or more of Examples 37-39 optionally include wherein the processing circuitry is further configured to invert the scaled replica and multiply the input baseband signal by the inverted scaled replica to generate the model distortion signal.

In Example 41, the subject matter of any one or more of Examples 37-40 optionally include wherein the processing circuitry is further configured to: compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself, and sum results of computing the plurality of memory polynomial equations to generate the output baseband signal.

In Example 42, the subject matter of Example 41 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 43, the subject matter of Example 42 optionally includes wherein the processing circuitry is further configured to determine the complex weighting of each polynomial of the polynomial equation by indirect learning.

Example 44 is a method of compensating envelope tracking (ET) nonlinearities in a wireless device, the method comprising: generating an input baseband signal; generating an envelope signal from the input baseband signal; shaping the envelope signal; filtering the shaped envelope signal to limit a bandwidth of the envelope signal to be less than a bandwidth of tracker circuitry; generating a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generating a model distortion signal as a ratio of the input baseband signal and the scaled replica, the model distortion signal emulating ET linearity degradation; generating an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; generating a radio frequency (RF) signal based on the output baseband signal; amplifying the RF signal by a power amplifier having an input voltage modulated by tracker circuitry based on a conditioned representation of the scaled replica; and transmitting the RF signal by RF front end circuitry and antenna.

In Example 45, the subject matter of Example 44 optionally includes wherein the ET linearity degradation is due to tracker bandwidth limitations.

In Example 46, the subject matter of any one or more of Examples 44-45 optionally include wherein the ET linearity degradation is due to ET delay offset errors.

In Example 47, the subject matter of any one or more of Examples 44-46 optionally include inverting the scaled replica; and multiplying the input baseband signal by the inverted scaled replica to generate the model distortion signal.

In Example 48, the subject matter of any one or more of Examples 44-47 optionally include computing a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and summing results of computing the plurality of memory polynomial equations to generate the output baseband signal.

In Example 49, the subject matter of Example 48 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 50, the subject matter of Example 49 optionally includes determining the complex weighting of each polynomial of the polynomial equation by indirect learning.

Example 51 is a non-transitory computer-readable storage medium that stores instructions for execution by one or more processors of a wireless device, to perform operations for compensating for nonlinearities in envelope tracking (ET), the operations to configure the one or more processors to: generate a input baseband signal; generate an envelope signal from the input baseband signal; shape the envelope signal; filter the shaped envelope signal to limit a bandwidth of the envelope signal to be less than a bandwidth of tracker circuitry; generate a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; generate a model distortion signal as a ratio of the input baseband signal and the scaled replica, the model distortion signal emulating ET linearity degradation; generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; generate a radio frequency (RF) signal based on the output baseband signal; amplify the RF signal by a power amplifier having an input voltage modulated by tracker circuitry based on a conditioned representation of the scaled replica; and transmit the RF signal by RF front end circuitry and antenna.

In Example 52, the subject matter of Example 51 optionally includes wherein the ET linearity degradation is due to tracker bandwidth limitations.

In Example 53, the subject matter of any one or more of Examples 51-52 optionally include wherein the ET linearity degradation is due to ET delay offset errors.

In Example 54, the subject matter of any one or more of Examples 51-53 optionally include wherein the operations further comprise operations to configure the one or more processors to invert the scaled replica and multiply the input baseband signal by the inverted scaled replica to generate the model distortion signal.

In Example 55, the subject matter of any one or more of Examples 51-54 optionally include wherein the operations to configure the one or more processors to generate the output baseband signal further include operations to configure the one or more processors to: compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and sum results of computing the plurality of memory polynomial equations to generate the output baseband signal.

In Example 56, the subject matter of Example 55 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 57, the subject matter of Example 56 optionally includes wherein the operations further comprise operations to configure the one or more processors to determine the complex weighting of each polynomial of the polynomial equation by indirect learning.

Example 58 is an apparatus of a wireless device, the apparatus configured to compensate for nonlinearities in envelope tracking (ET), the apparatus comprising: memory means; processing means coupled to the memory means; means for generating an input baseband signal; means for generating an envelope signal from the input baseband signal; means for shaping the envelope signal; means for filtering the shaped envelope signal to limit a bandwidth of the envelope signal to be less than a bandwidth of tracker circuitry; means for generating a scaled replica of an output signal of the tracker circuitry, the scaled replica generated based on the bandwidth-limited envelope signal, the tracker circuitry's output signal to be input to ET power amplifier (PA) circuitry as a variable voltage power supply, the tracker circuitry's output signal being varied by the tracker circuitry according to the bandwidth-limited envelope signal to increase efficiency of the ET PA circuitry; means for generating a model distortion signal as a ratio of the input baseband signal and the scaled replica, the model distortion signal emulating ET linearity degradation; means for generating an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; means for generating a radio frequency (RF) signal based on the output baseband signal; means for amplifying the RF signal by a power amplifier having an input voltage modulated by tracker circuitry based on a conditioned representation of the scaled replica; and means for transmitting the RF signal by RF front end circuitry and antenna.

In Example 59, the subject matter of Example 58 optionally includes wherein the ET linearity degradation is due to tracker bandwidth limitations.

In Example 60, the subject matter of any one or more of Examples 58-59 optionally include wherein the ET linearity degradation is due to ET delay offset errors.

In Example 61, the subject matter of any one or more of Examples 58-60 optionally include means for inverting the scaled replica; and means for multiplying the input baseband signal by the inverted scaled replica to generate the model distortion signal.

In Example 62, the subject matter of any one or more of Examples 58-61 optionally include means for computing a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself, and means for summing results of computing the plurality of memory polynomial equations to generate the output baseband signal.

In Example 63, the subject matter of Example 62 optionally includes wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where: xi and xj represent inputs to each of the plurality of memory polynomial circuits, each of xi and xj being one of the scaled replica, the model distortion signal, and the input baseband signal; Kxi,xj describes a maximum order of the polynomial equation; M is a memory depth of the polynomial equation; n is a discrete time index; and h is a complex weighting of each polynomial of the polynomial equation.

In Example 64, the subject matter of Example 63 optionally includes means for determining the complex weighting of each polynomial of the polynomial equation by indirect learning.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; flash memory, etc.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus for compensating nonlinearities in envelope tracking (ET) used in a mobile device, the apparatus comprising: memory; and processing circuitry, configured to:
  filter an envelope signal representing an envelope of an input baseband signal to limit a bandwidth of the envelope signal to be less than a bandwidth of tracker circuitry;
  generate a scaled replica of an output signal of the tracker circuitry based on the bandwidth-limited envelope signal;
  generate a model distortion signal based on the scaled replica and the input baseband signal, the model distortion signal emulating ET linearity degradation;
  generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and
  provide the output baseband signal to transmitter circuitry to be converted to an RF signal for transmission by the transmitter circuitry.

2. The apparatus of claim 1, wherein the ET linearity degradation is due to tracker bandwidth limitations.

3. The apparatus of claim 1, wherein the ET linearity degradation is due to ET delay offset errors.

4. The apparatus of claim 1, wherein the processing circuitry is further configured to:
  generate the envelope signal from the input baseband signal; and
  shape the envelope signal;
  wherein the shaped envelope signal is filtered and the scaled replica is generated based on the filtered shaped envelope signal.

5. The apparatus of claim 1, wherein the model distortion signal is based on a ratio of the input baseband signal and the scaled replica.

6. The apparatus of claim 1, wherein the processing circuitry is further configured to invert the scaled replica and multiply the input baseband signal by the inverted scaled replica to generate the model distortion signal.

7. The apparatus of claim 1, wherein the processing circuitry is further configured to:
  compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and
  sum results of computing the plurality of memory polynomial equations to generate the output baseband signal.

8. The apparatus of claim 7, wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where:
  $x_i$ and $x_j$ represent inputs to each of the plurality of memory polynomial circuits, each of $x_i$ and $x_j$ being one of the scaled replica, the model distortion signal, and the input baseband signal;
  $Kx_i,x_j$ describes a maximum order of the polynomial equation;
  M is a memory depth of the polynomial equation;
  n is a discrete time index; and
  h is a complex weighting of each polynomial of the polynomial equation.

9. The apparatus of claim 8, wherein the processing circuitry is further configured to determine the complex weighting of each polynomial of the polynomial equation by indirect learning.

10. The apparatus of claim 1, wherein the tracker circuitry's output signal is to be provided to ET power amplifier (PA) circuitry as a variable voltage power supply, the tracker circuitry's output signal being varied by the tracker circuitry according to the bandwidth-limited envelope signal to increase efficiency of the ET PA circuitry.

11. A method of compensating envelope tracking (ET) nonlinearities in a mobile device, the method comprising:
  filtering an envelope signal representing an envelope of an input baseband signal to limit a bandwidth of the envelope signal to be less than a bandwidth of tracker circuitry;
  generating a scaled replica of an output signal of the tracker circuitry based on the bandwidth-limited envelope signal;
  generating a model distortion signal based on the scaled replica and the input baseband signal, the model distortion signal emulating ET linearity degradation;
  generating an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and
  providing the output baseband signal to transmitter circuitry to be converted to an RF signal for transmission by the transmitter circuitry.

12. The method of claim 11, wherein the ET linearity degradation is due to tracker bandwidth limitations.

13. The method of claim 11, wherein the ET linearity degradation is due to ET delay offset errors.

14. The method of claim 11, further comprising:
  generating the envelope signal from the input baseband signal; and
  shaping the envelope signal;
  wherein the shaped envelope signal is filtered and the scaled replica is generated based on the filtered shaped envelope signal.

15. The method of claim 11, wherein generating the model distortion signal comprises:
  inverting the scaled replica; and
  multiplying the input baseband signal by the inverted scaled replica to generate the model distortion signal.

16. The method of claim 11, wherein generating the output baseband signal comprises:
computing a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and
summing outputs of the plurality of memory polynomial equations to generate the output baseband signal.

17. The method of claim 16, wherein each of the plurality of memory polynomial equations is described by:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where:
$x_i$ and $x_j$ represent inputs to each of the plurality of memory polynomial circuits, each of $x_i$ and $x_j$ being one of the scaled replica, the model distortion signal, and the input baseband signal;
$Kx_i,x_j$ describes a maximum order of the polynomial equation;
M is a memory depth of the polynomial equation;
n is a discrete time index; and
h is a complex weighting of each polynomial of the polynomial equation.

18. The method of claim 17, further comprising performing indirect learning to determine the complex weighting of each polynomial of the polynomial equation.

19. The method of claim 11, wherein the tracker circuitry's output signal is to be provided to ET power amplifier (PA) circuitry as a variable voltage power supply, the tracker circuitry's output signal being varied by the tracker circuitry according to the bandwidth-limited envelope signal to increase efficiency of the ET PA circuitry.

20. A non-transitory computer-readable storage medium that stores instructions for execution by one or more processors of a mobile device, to perform operations for compensating nonlinearities in envelope tracking (ET), the operations to configure the one or more processors to:
filter an envelope signal representing an envelope of an input baseband signal to limit a bandwidth of the envelope signal to be less than a bandwidth of tracker circuitry;
generate a scaled replica of an output signal of the tracker circuitry, the scaled replica generated based on the bandwidth-limited envelope signal;
generate a model distortion signal based on the scaled replica and the input baseband signal, the model distortion signal emulating ET linearity degradation;
generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET nonlinearities; and
provide the output baseband signal to transmitter circuitry to be converted to an RF signal for transmission by the transmitter circuitry.

21. The medium of claim 20, wherein the operations to configure the one or more processors to generate the model distortion signal further include operations to configure the one or more processors to:
invert the scaled replica; and
multiply the input baseband signal by the inverted scaled replica to generate the model distortion signal.

22. The medium of claim 20, wherein the operations further comprise operations to configure the one or more processors to:
generate the envelope signal from the input baseband signal; and
shape the envelope signal;
wherein the shaped envelope signal is filtered and the scaled replica is generated based on the filtered shaped envelope signal.

23. The medium of claim 20, wherein the operations to configure the one or more processors to generate the output baseband signal further include operations to configure the one or more processors to:
compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and
sum results of computing the plurality of memory polynomial equations to generate the output baseband signal;
wherein each of the plurality of memory polynomial equations is described by:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where:
$x_i$ and $x_j$ represent inputs to each of the plurality of memory polynomial circuits, each of $x_i$ and $x_j$ being one of the scaled replica, the distortion signal, and the baseband signal;
$Kx_i,x_j$ describes a maximum order of the polynomial equation;
M is a memory depth of the polynomial equation;
n is a discrete time index; and
h is a complex weighting of each polynomial of the polynomial equation.

24. The medium of claim 20, wherein the tracker circuitry's output signal is to be provided to ET power amplifier (PA) circuitry as a variable voltage power supply, the tracker circuitry's output signal being varied by the tracker circuitry according to the bandwidth-limited envelope signal to increase efficiency of the ET PA circuitry.

25. An apparatus of a mobile device, the apparatus configured to compensate nonlinearities in envelope tracking (ET), the apparatus comprising: memory; and processing circuitry, configured to:
generate an input baseband signal;

generate an envelope signal from the input baseband signal;

shape the envelope signal;

filter the shaped envelope signal to limit a bandwidth of the envelope signal to be less than a bandwidth of tracker circuitry;

generate a scaled replica of an output signal of the tracker circuitry, the scaled replica generated based on the bandwidth-limited envelope signal;

generate a model distortion signal as a ratio of the input baseband signal and the scaled replica, the model distortion signal emulating ET linearity degradation;

generate an output baseband signal based on the scaled replica, the model distortion signal, and the input baseband signal, the output baseband signal being pre-distorted relative to the input baseband signal according to the scaled replica, the model distortion signal, and the input baseband signal to compensate for degradations in transmit signal quality due to ET non-linearities;

generate a radio frequency (RF) signal based on the output baseband signal;

amplify the RF signal by a power amplifier having an input voltage modulated by tracker circuitry based on a conditioned representation of the scaled replica; and transmit the RF signal by RF front end circuitry and antenna.

26. The apparatus of claim 25, wherein the processing circuitry is further configured to:

compute a plurality of memory polynomial equations operating on a plurality of signal pairs, the plurality of signal pairs including the scaled replica paired with the model distortion signal, the scaled replica paired with the input baseband signal, the model distortion signal paired with the input baseband signal, the scaled replica paired with itself, the model distortion signal paired with itself, and the input baseband signal paired with itself; and sum results of computing the plurality of memory polynomial equations to generate the output baseband signal.

27. The apparatus of claim 26, wherein each of the plurality of memory polynomial equations implement the following polynomial equation:

$$P(x_i, x_j) = \sum_{p=1}^{K_{x_i,x_j}} \sum_{k_1=0}^{M_{x_i,x_j}} \sum_{k_2=0}^{M_{x_i,x_j}} h_{x_i,x_j,k_1,k_2} * x_i(n-k_1) * |x_j(n-k_2)|^{p-1}$$

where:

$x_i$ and $x_j$ represent inputs to each of the plurality of memory polynomial circuits, each of $x_i$ and $x_j$ being one of the scaled replica, the model distortion signal, and the input baseband signal;

$Kx_i,x_j$ describes a maximum order of the polynomial equation;

M is a memory depth of the polynomial equation;

n is a discrete time index; and h is a complex weighting of each polynomial of the polynomial equation.

28. The apparatus of claim 27, wherein the processing circuitry is further configured to determine the complex weighting of each polynomial of the polynomial equation by indirect learning.

29. The apparatus of claim 25, wherein the tracker circuitry's output signal to be provided to ET power amplifier (PA) circuitry as a variable voltage power supply, the tracker circuitry's output signal being varied by the tracker circuitry according to the bandwidth-limited envelope signal to increase efficiency of the ET PA circuitry.

* * * * *

UNITED STATES PATENT AND TRADEMARK OFFICE
CERTIFICATE OF CORRECTION

PATENT NO. : 9,973,370 B1  
APPLICATION NO. : 15/614817  
DATED : May 15, 2018  
INVENTOR(S) : Langer et al.

Page 1 of 1

It is certified that error appears in the above-identified patent and that said Letters Patent is hereby corrected as shown below:

On the Title Page

In item (*), in "Notice", in Column 1, Line 3, delete "days. days." and insert --days.-- therefor Signed and Sealed this  
Fourth Day of June, 2019

Andrei Iancu  
*Director of the United States Patent and Trademark Office*